(12) United States Patent
Rzyski

(10) Patent No.: US 6,393,372 B1
(45) Date of Patent: *May 21, 2002

(54) AUTOMATED FREQUENCY STEPPING NOISE MEASUREMENT SYSTEM

(76) Inventor: Eugene Rzyski, 3692 Acacia St., Irvine, CA (US) 92616

( * ) Notice: Subject to any disclaimer, the term of this patent is extended or adjusted under 35 U.S.C. 154(b) by 0 days.

This patent is subject to a terminal disclaimer.

(21) Appl. No.: 09/313,435

(22) Filed: May 17, 1999

(51) Int. Cl.$^7$ .............................................. G06F 19/00
(52) U.S. Cl. ......................... 702/111; 702/111; 702/69; 330/149
(58) Field of Search ............................ 702/111, 57, 58, 702/59, 69; 324/309; 330/149

(56) References Cited

U.S. PATENT DOCUMENTS

| | | | | |
|---|---|---|---|---|
| 4,336,505 A | * | 6/1982 | Meyer | 331/1 R |
| 4,580,105 A | | 4/1986 | Myer | 330/149 |
| 4,636,747 A | * | 1/1987 | Selim | 331/1 R |
| 4,818,996 A | | 4/1989 | Kimura | 341/144 |
| 4,918,373 A | | 4/1990 | Newberg | 324/613 |
| 5,077,532 A | | 12/1991 | Obermann et al. | 330/151 |
| 5,119,040 A | | 6/1992 | Long et al. | 330/149 |
| 5,157,345 A | | 10/1992 | Kenington et al. | 330/149 |
| 5,323,119 A | | 6/1994 | Powell et al. | 330/151 |
| 5,334,946 A | | 8/1994 | Kenington et al. | 330/144 |
| 5,365,187 A | | 11/1994 | Hornak et al. | 330/10 |
| 5,412,325 A | | 5/1995 | Meyers | 324/613 |
| 5,455,537 A | | 10/1995 | Larkin et al. | 330/52 |
| 5,459,680 A | | 10/1995 | Zimmerman et al. | 364/721 |
| 5,493,304 A | | 2/1996 | Lee et al. | 342/360 |
| 5,524,281 A | | 6/1996 | Bradley | 455/67.3 |

(List continued on next page.)

FOREIGN PATENT DOCUMENTS

| | | | |
|---|---|---|---|
| DE | 28 03 608 | 8/1979 | ........... G01R/27/28 |
| DK | 28 03 608 | 8/1979 | |
| EP | 0 747 714 A2 | 12/1996 | ........... G01R/29/26 |
| WO | WO 89/08848 | 9/1989 | ........... G01R/29/26 |
| WO | WO 97/46890 | 11/1997 | |
| WO | WO 97/46890 | 12/1997 | |
| WO | WO 99/36793 | 7/1999 | ........... G01R/27/00 |

*Primary Examiner*—Arthur T. Grimley
*Assistant Examiner*—Mohamed Charioui
(74) *Attorney, Agent, or Firm*—Drummond & Duckworth

(57) ABSTRACT

A noise measurement test system is provided for making phase noise measurements of a unit under test (UUT). The noise measurement test system comprises a variable amplifier, a variable low noise source, a variable phase shifter, a mixer, a variable low noise matching amplifier, analog-to-digital converter, a processor and a spectrum analyzer. A first low noise signal, created by the low noise source, is routed through the unit under test and variable amplifier to the mixer. A second low noise signal, also created by the low noise source, is routed through the variable phase shifter to the mixer. The mixer places the received signals in phase quadrature and outputs a measurement test signal which is routed through an analog-to-digital convertor to the processor and spectrum analyzer. The processor includes control links for adjusting the amplifier, low noise source and phase shifter to ensure that the signals received by the mixer are in phase quadrature. The processor also controls the low noise matching amplifier to ensure that there is proper impendence between the mixer and analog-to-digital convertor, and to ensure that the measurement test signal is of sufficient amplification for proper noise testing. In preferred embodiments, the processor provides for automatic control of the test system through an entire test protocol. In additional preferred embodiments, the noise measurement test system provides for calibration signals which vary in amplitude and frequency relative to a carrier signal.

13 Claims, 4 Drawing Sheets

U.S. PATENT DOCUMENTS

| | | |
|---|---|---|
| 5,528,196 A | 6/1996 | Baskin et al. ................ 330/151 |
| 5,608,331 A | 3/1997 | Newberg et al. ............. 324/613 |
| 5,619,168 A | 4/1997 | Myer ......................... 330/149 |
| 5,621,354 A | 4/1997 | Mitzlaff ....................... 330/52 |
| 5,623,227 A | 4/1997 | Everline et al. ................ 330/2 |
| 5,742,201 A | 4/1998 | Eisenberg et al. .............. 330/2 |
| 5,758,275 A | 5/1998 | Cox et al. ................... 455/307 |
| 5,808,512 A | 9/1998 | Bainvoll et al. ............. 330/151 |
| 5,886,573 A | 3/1999 | Kolanek ....................... 350/10 |
| 5,892,397 A | 4/1999 | Belcher et al. .............. 330/149 |
| 5,903,819 A | 5/1999 | Romesburg ................... 455/63 |
| 5,907,624 A | 5/1999 | Takada ....................... 381/94.2 |
| 6,172,564 B1 * | 1/2001 | Rzyski ........................ 330/149 |

\* cited by examiner

AUTOMATED FREQUENCY STEPPING NOISE MEASUREMENT SYSTEM

BACKGROUND OF THE INVENTION

The present invention relates to devices which measure noise present in radio frequency (RF) signals. More specifically, the present invention relates to noise measurement test systems for making phase noise and frequency noise measurements of devices that amplify or modify an RF signal.

Amplifiers are devices that increase the gain of a carrier signal. Amplifiers play a key role in many electronic systems today. Parameters such as gain, gain flatness, compression point, intermodulation and others have always been important to optimizing the performance of an amplifier. In addition, new parameters of an amplifier have become important to maintain the performance of an overall system. Unfortunately, in addition to amplifying the carrier signal, amplifiers typically introduce RF energy into an original RF signal in the form of intermodulation and sideband noises, including thermal noise, shot noise and flicker noise. This noise is typically random and is referred to as additive and residual phase noise and frequency noise. In addition, spurious noise signals can be generated by an amplifier. These consist of discreet signals appearing as distinct components called "spurs" which can be related to power line and/or vibration modulation. It is important that this noise be minimized to the greatest extent possible. Since frequency noise is a function of phase noise, these noise components will be collectively referred to herein as phase noise.

The presence of phase noise in RF signal sources is a concern in several applications including applications related to analog and digital communications such as code division multiple access (CDMA) and time division multiple access (TDMA) cellular communication systems. The European Global System for Mobile communications (GSM) has promulgated detailed standards which define the operating requirements for both mobile and base station transmitters because the radio communication system as a whole will work properly only if each component operates within precise limits. Mobile transmitters and base stations must transmit outgoing RF signals with sufficient power, sufficient fidelity to maintain call quality and without transmitting excess power into frequency channels and time slots allocated to others.

For communications equipment particularly, it is important to minimize spurs and distortion products even when they appear below the amplitude level of the signal produced by an amplifier. This is important because the distortion or noise from numerous communication modules in a communications system tend to statistically add, thereby raising the level of noise in the overall system. Accordingly, it has now become important to measure the phase noise levels of an amplifier even below the level of the signal produced by the amplifier.

Phase noise is also of great concern in radar equipment, especially Doppler radar equipment which determines the velocity of a moving target by measuring the shifts in frequencies caused by return echos from a transmitted signal. The return echo signal is typically amplified for measurement. Unfortunately, a very large noise floor, up to 40 dB, has been observed near the carrier frequency. Such high background noise caused by the amplifiers of the radar equipment can result in degradation in target detection sensitivity and prevention of proper operation of land based and airborne active array radar. In some instances, it has been found that the introduction of phase noise caused by the amplifiers can partially or even totally mask the echo signal.

The most straight forward and least expensive technique for measuring the phase noise of an amplifier is to input a signal of known frequency into the amplifier and connect the output to a spectrum analyzer. However, it is difficult to measure the phase noise which is close in frequency to the carrier signal. In addition, using this technique, it is impossible to measure the noise caused by the amplifier which is below the amplitude of the amplifier output signal. In order to minimize the amount of noise generated by a particular system, it is highly advantageous to be able to measure that noise. As a result, there has been a continuing need for equipment which can make phase noise measurements.

Two approaches predominate for making phase noise measurements of an RF signal. The first system is a noise measurement test apparatus that uses a waveguide delay line descriminator. For example, U.S. Pat. No. 5,608,331 issued to Newberg et al. discloses a test system for making phase noise and amplitude noise measurements of microwave signals using a waveguide, coax and fiberoptic delay lines. The delay line descriminator uses the RF input from a unit under test (UUT) to generate a reference signal via the delay line for phase noise evaluation. The signal from the unit under test is split into first and second paths and combined again at a mixer which places the respective signals 90° out of phase (in phase quadrature). Where the test system introduces very low noise or substantially no noise, the mixer outputs demodulated phase noise which can be measured by a sweeping spectrum analyzer.

The second conventional approach for making phase noise measurements makes use of the combination of noise from two phase lock RF sources. A low noise source is provided which provides a carrier signal to a unit under test, typically an amplifier. The low noise source also outputs a second low noise signal, at the same frequency as the carrier signal, which is combined with the carrier signal from the amplifier in a mixer. Using a phase shifter, the mixer places the two signals in phase quadrature.

Assuming no significant noise in the test setup, the mixer output signal represents the noise of the unit under test which can be measured by a sweeping spectrum analyzer.

Unfortunately, measurement of modulation and wide band noise measurements using prior art systems is expensive, difficult and time consuming. At wide offsets, such as 600 kHz, these measurements require high dynamic range which has historically been expensive. For these reasons, wide band noise measurements are typically only performed on a sample basis. Even conducting noise measurements on a sample basis is extremely time consuming as this technique requires a series of separate measurements to be performed requiring a lot of retuning of the test equipment. For example, utilizing the delay line technique described above, one must adjust phase shifters, attenuators and additional amplifiers at several frequency assignments across a broad bandwidth. Similarly, the above-described ultra low noise source test system typically requires making manual adjustments of a low noise source, a phase shifter, an additional amplifier and a buffer for each frequency offset across a broad bandwidth. The manual adjustment of each of these units usually takes ten minutes or more for each test measurement. Moreover, to ensure test accuracy, a large number of test samples must be taken with the increase in the number of sample measurements resulting in a decrease in the standard deviation in error of the noise measurements of the unit under test. Simply, sufficient readings must be taken to verify correct operation of the unit under test.

Unfortunately, performing such tests is both expensive and time consuming. Moreover, the prior art test systems are very expensive, typically costing between $100,000 and $200,000. In addition, these systems must be purchased piecemeal, requiring the separate purchase of amplifiers, low noise sources, signal attenuators, phase shifters, mixers and sweeping noise analyzers, which must be assembled to create a desired test system. The interconnection on each of these components creates additional regions for the introduction of phase noise into the system.

There is thus a need for a noise measurement test system which can accurately measure low level phase noise.

It would also be advantageous if a noise measurement test system were provided which had a high degree of reproducibility in the test measurements. To this end, it would be highly advantageous if a noise measurement test system were provided which eliminated a need for manual manipulation of the different components of the test system including the amplifiers, phase shifters, attenuators, low noise sources, etc. which typically must be adjusted for each noise measurement.

It would also be highly advantageous if a noise measurement test system could be provided in a single modular component which was lightweight and of compact size.

SUMMARY OF THE PRESENT INVENTION

Briefly, in accordance with the invention, I provide an improved apparatus and method for automatically testing the phase noise of a unit under test. It is believed that my invention is particularly suitable for testing the phase noise of amplifiers even below the noise level of a carrier signal. The noise measurement system includes a variable low noise source for producing an adjustable low noise signal. The variable low noise source includes two outputs for outputting identical low noise signals, or is coupled to a splitter for splitting a single low noise signal into two identical low noise source signals. The first low noise signal is routed to a unit under test. The unit under test includes an input for receiving a first low noise carrier signal and an output for outputting a carrier signal. The UUT carrier signal is then routed through a variable amplifier where it is thereafter received by a mixer.

The second low noise signal output from the variable low noise source, is transmitted to a variable phase shifter which adjusts the phase of the second low noise signal to be 90° out of phase (in phase quadrature) with the UUT signal passing through the variable amplifier. After being shifted in phase, the second low noise signal is received by the mixer at a second input port where it is combined with the UUT signal and output from a mixer output port. The variable amplifier and variable phase shifter are both adjusted so that the UUT signal and second noise signal are in phase quadrature and of matching amplitude such that if there were no noise in the system or in the UUT, a direct current (DC) is output from the mixer output port. However, assuming noise in the UUT and very low noise in the test system, the mixer outputs a signal representative of the noise of the unit under test. The signal output from the mixer, hereinafter referred to as a "measurement test signal", is then sent to a variable low noise matching amplifier. The variable low noise matching amplifier both amplifies the measurement test signal and acts as a buffer. The matching variable amplifier is constructed to add very low noise so as not to interfere with the noise measurements of the unit under test and provides for amplification of the measurement test signal to enhance the ability to measure any noise in the unit under test.

After passing through the low noise matching amplifier the measurement test signal is received by an analog-to-digital converter (ADC) which converts the analog measurement test signal into digital data. The digital data is then transmitted to a processor for evaluation prior to sending the measurement test signal to a spectrum analyzer. The spectrum analyzer uses standard, windowed, fast or discreet fourier transforms that accurately measures the noise spectrum of the measurement test signal. These fourier transformers are known to those skilled in the art and will not be discussed in detail herein.

The processor is connected by a plurality of control lines to the variable amplifier, variable low noise source, variable phase shifter and the variable low noise matching amplifier. The processor sets levels and makes adjustments to the amplifier, low noise source, phase shifter and matching amplifier to obtain initial calibration and maintain optimum system sensitivity for measuring the phase noise of a unit under test. The processor performs these automated control functions to adjust the variable low noise source, amplifier, phase shifter and matching amplifier which are normally done manually. For example, to measure the noise of a unit under test, several test measurements of the unit under test must be made with the low noise source producing a carrier signal at different offset frequencies. Prior art systems require that the low noise source first be manually adjusted. The phase shifter must then be manually adjusted to ensure that the signals received by the mixer are in phase quadrature. The amplifier must also be adjusted to ensure that the signals received by the mixer are of the same amplitude. Moreover, the matching amplifier must be adjusted to ensure proper impendence between the mixer and analog-to-digital converter. These manual adjustments typically take ten minutes or more. The processor of the present invention provides for automatic adjustments of these components which typically can be accomplished in less than one minute. In addition, the processor of the present invention provides for the creation and automation of an entire test program, or protocol. A unit under test can be tested, "stepped" across a predetermined bandwidth by preprogramming the test system to conduct numerous test measurements of the UUT at different low noise source offset frequencies. In addition, the processor can be preprogrammed to conduct a sufficient number of test samples at each frequency offset to ensure that the noise level of the unit under test falls within acceptable levels.

To control the measurement test system, the signal processor takes the digitized output from the ADC to both calibrate the system and to ensure that the amplifier, low noise source and phase shifter are set to correct levels. More particularly, the output from the ADC enables the processor to determine whether the low noise source is providing a carrier signal at a correct frequency. By evaluating the output from the ADC, the processor can determine that the phase shifter is properly maintaining the signals received by the mixer in phase quadrature. Similarly, any failure by the variable amplifier to maintain a proper level of amplification of the UUT signal as received by the mixer can be corrected by the processor. If any of these components are not functioning optimally, the processor makes required adjustments to ensure proper noise testing of the unit under test by the measurement test signal.

In a preferred embodiment, the variable low noise source of the present invention outputs both a variable carrier signal and a variable calibration signal. The calibration signal is a very low level noise sideband having a precisely known magnitude relative to the magnitude of the carrier signal, typically about 60 dB below the amplitude of the carrier signal. The calibration signal enables calibration of the test measurement system. This calibration signal is not eliminated by phase quadrature in the mixer and would thus appear on the spectrum analyzer. Since the calibration signal has a known magnitude, the displayed height of the phase noise can be compared to the displayed height of the calibration signal. Any noise caused by the unit under test can be compared with calibration signal to quantitatively measure the phase noise of the unit under test.

In addition, the present invention provides for quantitatively calibrating the system at multiple levels by adjusting the magnitude of the calibration signal. More particularly, it is preferred that when the measurement test system is calibrated, that the calibration signal be provided sequentially at different magnitudes. For example, the calibration signal is first provided a −10 db relative to the carrier signal. Thereafter, the calibration signal is provided at −20 db, −30 dB, −40 dB, −50 dB and −60 dB relative to the carrier signal. The processor then graphically displays each of these calibration levels on the spectrum analyzer so as to provide a greater measure of accuracy in determining the actual phase noise created by the unit under test.

In an additional preferred embodiment, the processor controls the variable low noise source to produce multiple calibration signals which are offset in frequency during the test system calibration procedure. In other words, the present invention provides for calibrating the system in frequency and in amplitude each time the system is calibrated. For example, in addition to calibrating the system by producing calibration signals at −10 db through −60 db relative to the carrier signal, during calibration, the low noise source produces several additional calibration signals which are offset in frequency relative to the carrier signal. The processor then graphically displays each of these calibration levels on the spectrum analyzer so as to provide a greater measure of accuracy in determining the actual frequency of spurs or distortion products created by the unit under test. This information can be useful for determining the actual cause of any noise produced by the unit under test.

It is thus an object of the present invention to provide an improved noise measurement test system for measuring the RF noise of a unit under test.

It is an additional object of the present invention to provide an automated noise measurement test system which provides for automatic adjustments of the components of the system which can typically be accomplished in less than one minute. In addition, it is an object of the present invention to provide for an automated noise measurement test system which can create and implement an entire automated test program to desired requirements.

It is still another object of the present invention to provide an automated noise measurement test system which can calibrate the system at several decibel levels relative to the carrier signal and at several offset frequencies relative to the carrier signal each time the system is calibrated.

These and other further advantages of the present invention will be appreciated by those skilled in the art upon reading the following detailed description with reference to the attached drawings.

DETAILED DESCRIPTION OF THE INVENTION

Figure 1:
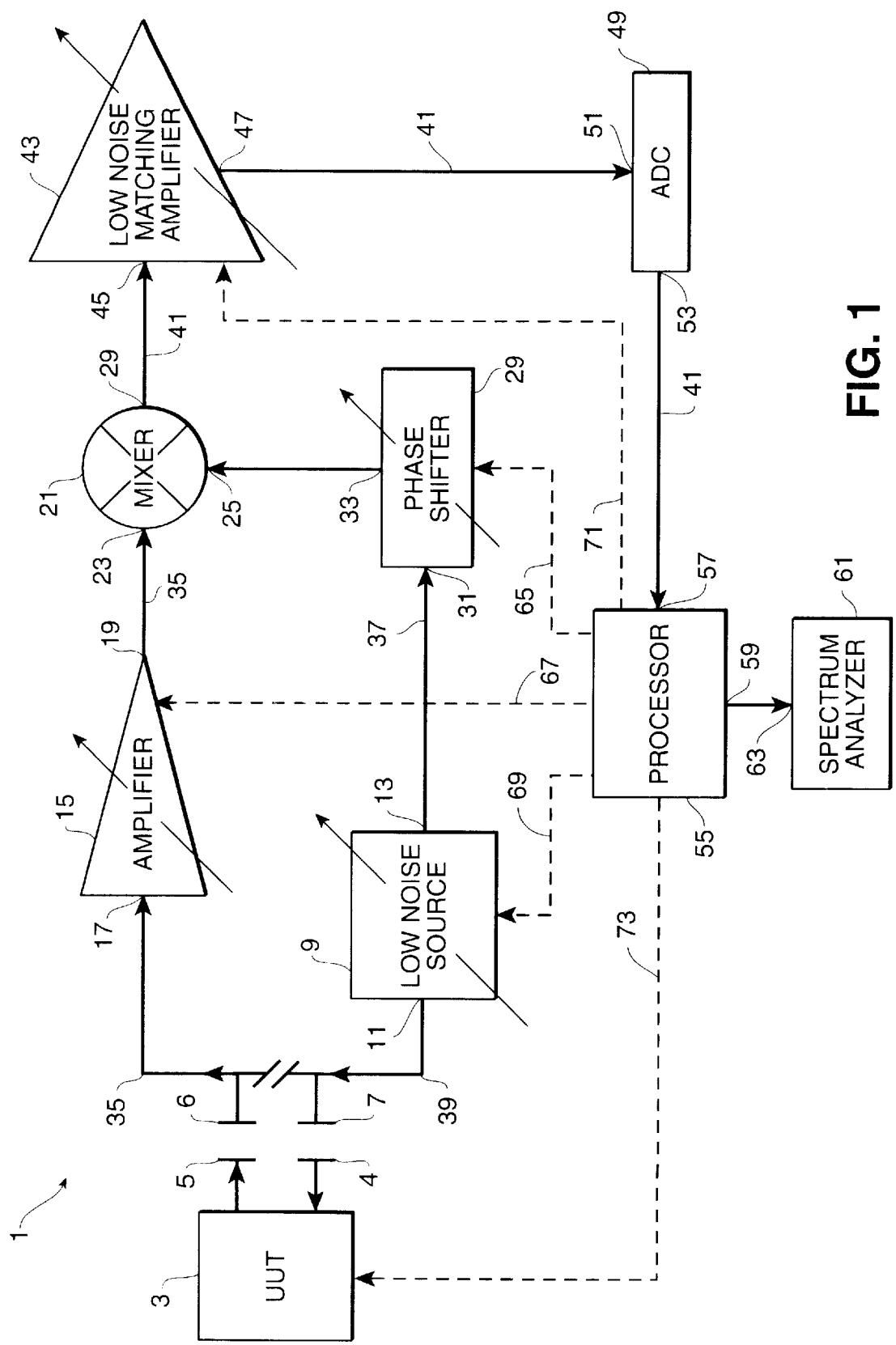
FIG. 1 is a diagram showing the automated noise measurement test system of the present invention.

While the present invention is susceptible of embodiment in various forms, there is shown in the drawings and will hereinafter be described the presently preferred embodiments of the invention with the understanding that the present disclosure is to be considered as an exemplification of the invention and is not intended to limit the invention to the specific embodiments illustrated.

With reference to FIG. 1, the present invention provides for an improved noise measurement test system 1 for measuring the noise added to a carrier signal 39 by a unit under test 3. The unit under test 3 includes an input 4 for receiving a low noise carrier signal 39 transmitted from the noise measurement system though output port 7. The unit under test 3 modifies, amplifies or otherwise adjusts the carrier signal 39 and outputs a UUT signal 35 from an output port 5. The UUT signal 35 is received by a measurement test system input port 6 where it is routed through a variable amplifier 15 having an input port 17 and an output port 19. After being routed through the variable amplifier 15, the UUT signal 35 is received by a mixer 21 through a first mixer input 23.

The noise measurement test system 1 of the present invention further includes a variable low noise source 9 which produces the low noise carrier signal 39 provided to the unit under test. The low noise source also provides a second low noise signal 37, of identical frequency as the carrier signal 39, which is provided through output port 13. The second low noise signal 37 is then forwarded to a variable phase shifter 29 through an input port 31 where it's phase is adjusted and then output through the phase shifter's output port 33. After being adjusted in phase by the variable phase shifter 29, the second low noise signal 37 is routed to the mixer 21 through an input port 25.

In operation, the variable phase shifter 29 adjusts the phase of the second low noise signal 37 so that it is 90° out of phase (in phase quadrature) with the UUT signal 35 when it is received by mixer 21. Moreover, the variable amplifier 15 is also adjustable so that it may be adjusted to amplify the UUT signal 35 so that it has a matching amplitude to that of the second low noise signal 37 when received by mixer 21. The mixer 21 combines the UUT signal 35 and second low noise signal 37 so that the signals are in phase quadrature. Assuming negligible noise in the variable amplifier 15, variable low noise source 9, variable phase shifter 29 and mixer 21, the output signal, referred to as a measurement test signal, represents the noise of the unit under test 3. This measurement test signal 41 is then routed through the input 45 and output 47 of a low noise matching amplifier 43. The low noise matching amplifier 43 amplifies the magnitude of the measurement test signal 41 so that any noise in the test signal can be more easily measured. Moreover, the low noise matching amplifier 43 acts as a buffer to ensure that the impedance is optimally maintained between the mixer 21 and an analog-to-digital converter 49 which receives the measurement test signal 41 after it is routed through the low noise matching amplifier 43.

The analog-to-digital converter 49 has an input port 51 for receiving the measurement test signal 41. After being received by the analog-to-digital converter 49, the measurement test signal 41 is converted in first-in, first-out manner into a digital format and then output through output port 53. The measurement test signal 41, now in digital format, is forwarded to a processor 55 through input port 57. The processor 55 performs several evaluation operations of the measurement test signal 41 and routes the signal, typically unaltered, through an output port 59 to a spectrum analyzer 61 having an input port 63. The spectrum analyzer 61 includes a video display for providing a pictorial depiction of the measurement test signal 41.

The noise measurement test system 1 of the present invention also includes a plurality of control lines 65, 67, 69 and 71 connecting the processor 55 to the variable phase shifter 29, variable amplifier 15, variable low noise source 9 and variable low noise matching amplifier 43, respectively. The processor 55 sets testing levels predetermined by the test system operator and makes adjustments to the amplifier 15, low noise source 9, phase shifter 29 and low noise matching amplifier 43 to obtain initial calibration of the system and to maintain optimum sensitivity of the system for measuring the phase noise of a unit under test 3. For example, to measure the phase noise of a unit under test 3, typically several measurements of phase noise of the unit under test 3 must be taken with the low noise source producing carrier signals at different offset frequencies.

Figure 4:
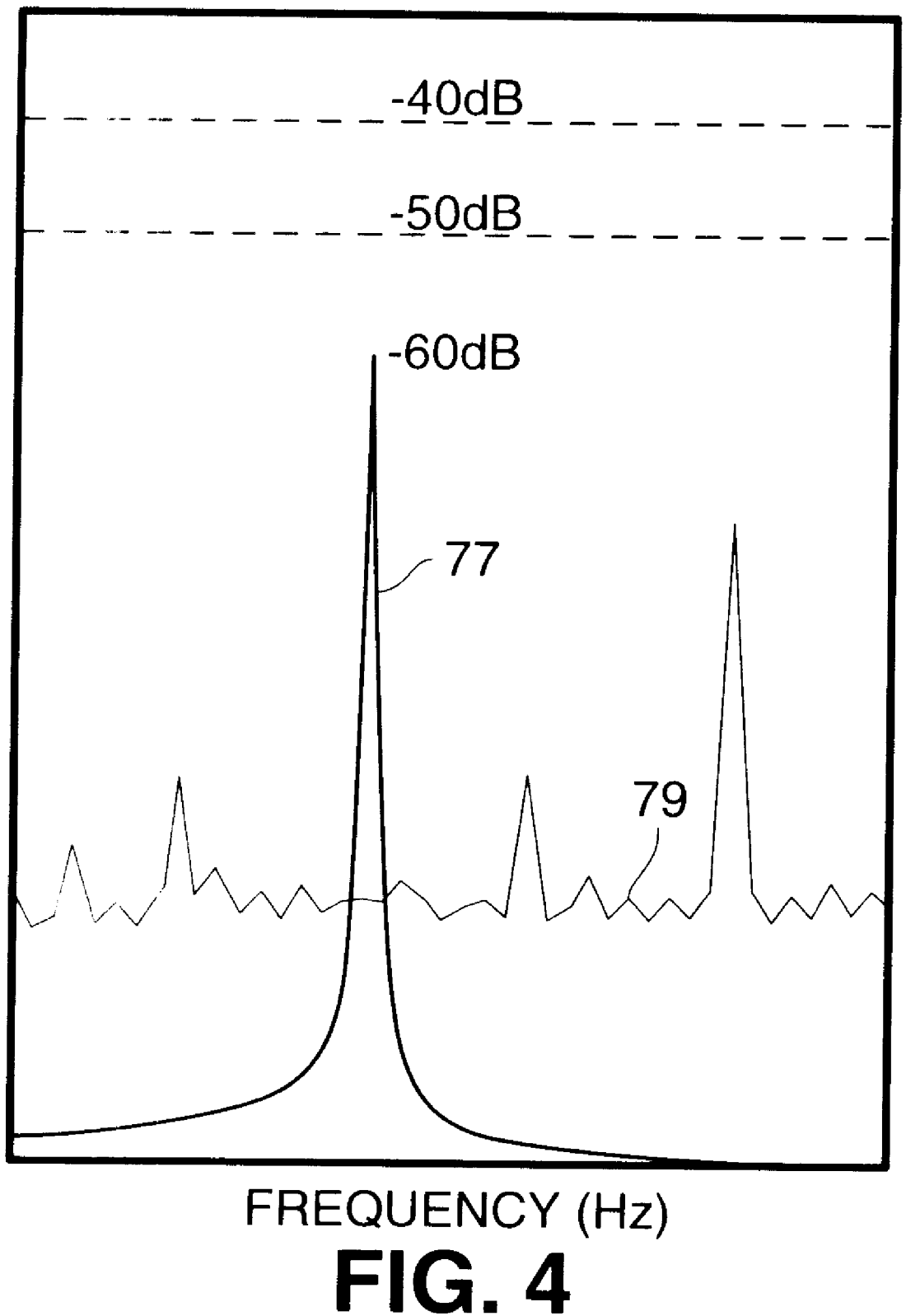
FIG. 4 is graphical depictions as would be shown on a spectrum analyzer illustrating the measurement test signal of a unit under test compared to a calibration signal created by the low noise source of the present invention.

A testing protocol for a unit under test 3 would first require calibration of the entire system to ensure that the noise measurement test system 1 can accurately quantitate the phase noise produced by the unit under test 3 and to ensure that the noise measurement test system 1 is not introducing an undue amount of noise into the test setup itself. With reference also to FIGS. 2 and 3, in a preferred embodiment, the processor 55 controls the low noise source 9 to produce both a variable carrier signal 75 and a variable calibration signal 77. The calibration signal 77 is a very low noise sideband having a precisely known frequency and magnitude relative to that of the carrier signal 75. Typical calibration signals 77 may have a magnitude about 60 dB below the magnitude of the carrier signal itself. As shown in FIG. 4, since the calibration signal 77 has a known magnitude, the displayed height of any phase noise of the measurement test signal 79 can be compared to the displayed height of the calibration signal 77 to provide a quantitative measurement of the phase noise of the unit under test 3.

Figure 2A:
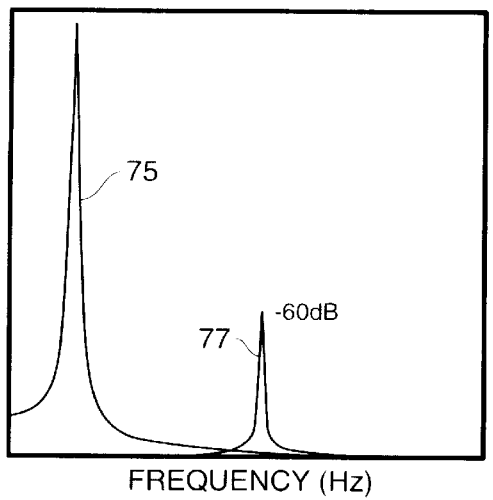
FIGS. 2(a)–2(f) are graphical depictions as would be shown on a spectrum analyzer illustrating the carrier signal and calibration signals created by the low noise signal source of the present invention with the calibration signals adjusted to different decibel levels relative to the carrier signal.
Figure 2B:
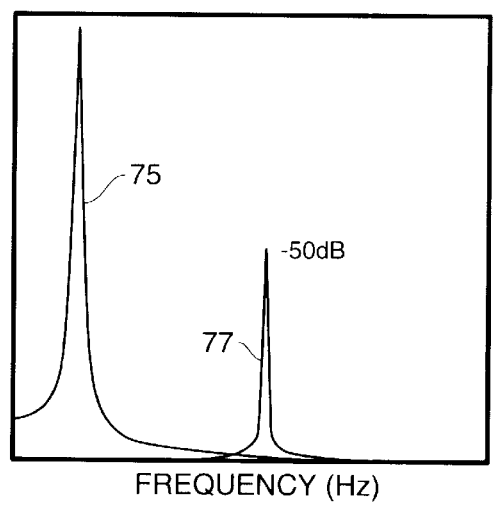
Figure 2C:
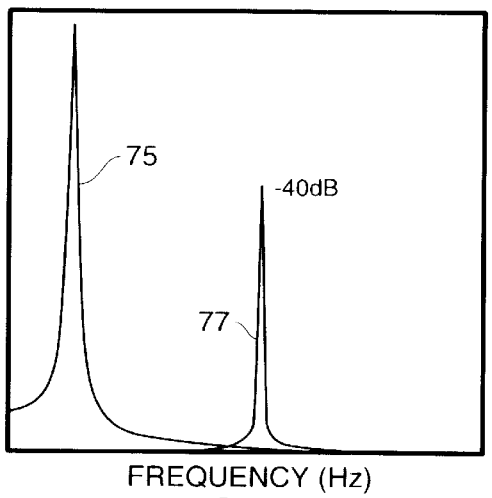
Figure 2D:
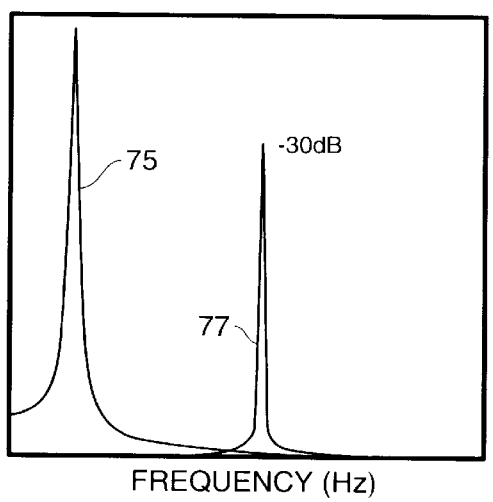
Figure 2E:
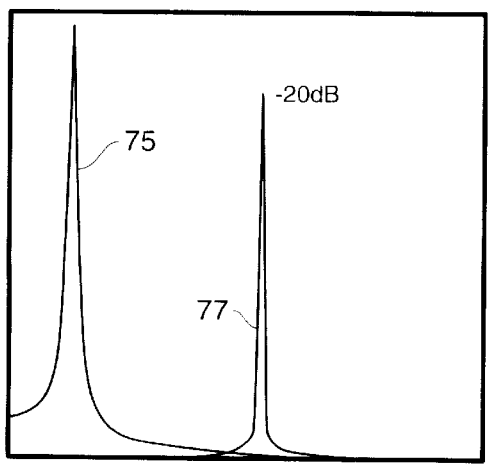
Figure 2F:
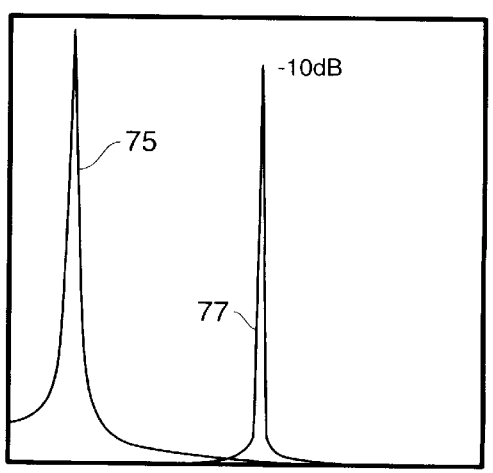
Figure 3A:
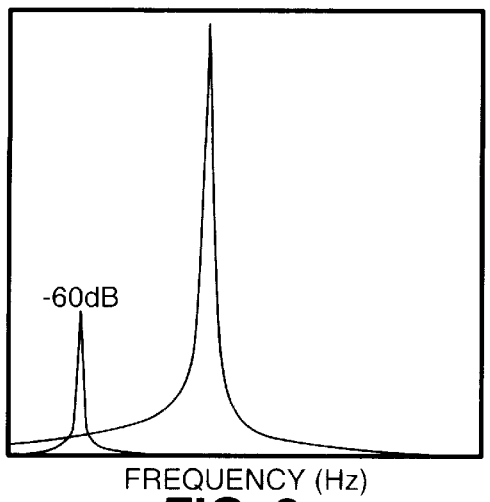
FIGS. 3(a)–3(f) are graphical depictions as would be shown on a spectrum analyzer illustrating the carrier signal and calibration signals created by the low noise source of the present invention in which the calibration signal is adjusted to calibrate the system at several offset frequencies relative to the carrier signal.
Figure 3D:
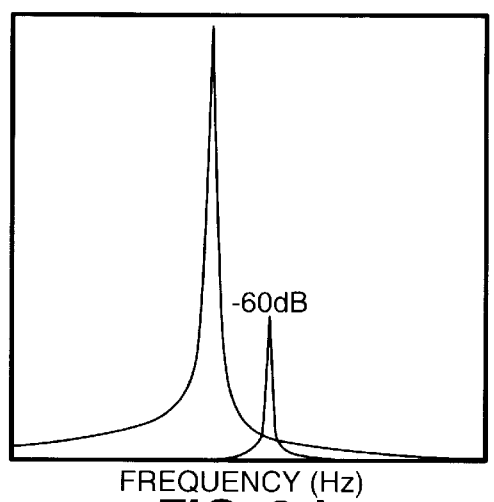
Figure 3B:
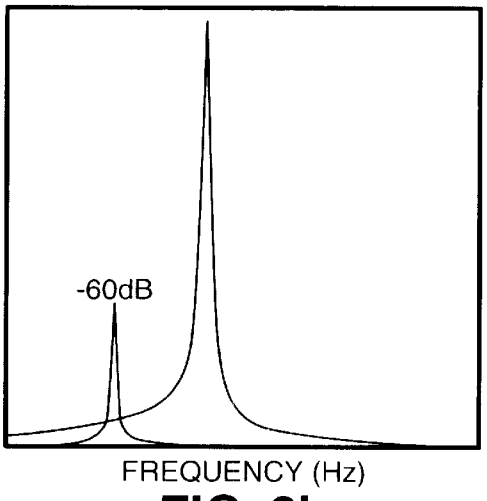
Figure 3E:
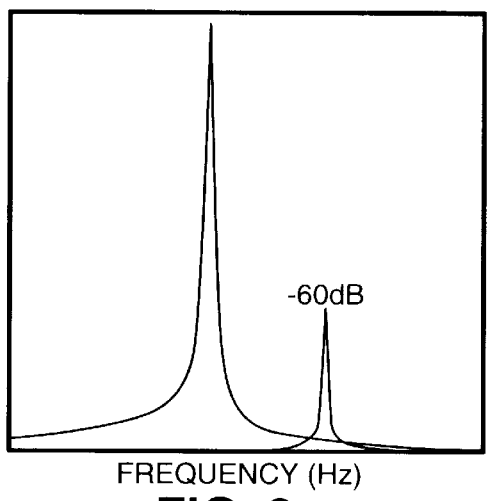
Figure 3C:
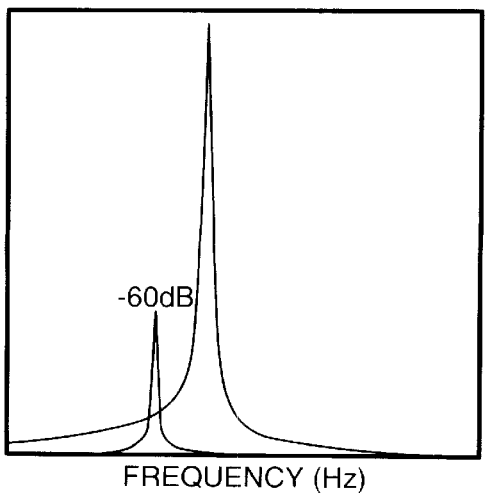
Figure 3F:
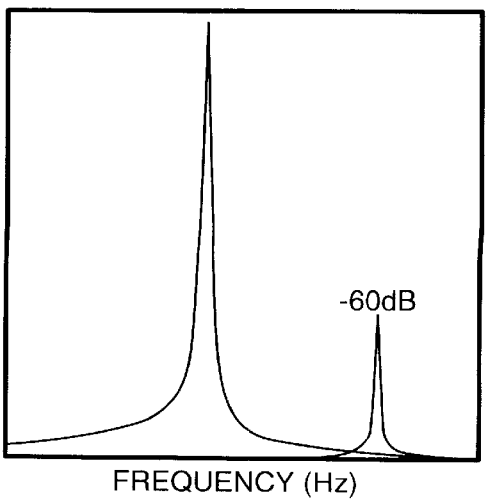

In an additional preferred embodiment, the calibration process employs several calibration signals 77 of different magnitude levels. For example, with reference to FIGS. 2(a)–2(f), calibration signals 77 are provided sequentially at different magnitudes to better calibrate the noise measurement test system 1 of the present invention. For example, as shown in FIG. 2(a), a calibration signal 77 is first provided at −60 db. With reference to FIGS. 2(b)–2(f), carrier signals 75 are then sequentially provided at −50 dB, −40 dB, −30 dB, −20 db and −10 db, respectively. As shown on FIG. 4, these levels can then be graphically displayed on the spectrum analyzer 61 to enable the test operator to more accurately measure any spurious products or noise perturbations shown on the video display.

In an additional preferred embodiment, a processor 55 controls the variable low noise source 9 to produce multiple calibration signals 77 which are offset in frequency when performing initial calibration of the noise measurement test system 1 of the present invention. With reference to FIGS. 3(a)–3(f), three calibration signals 77 are provided at frequencies lower than the carrier signal 75, while three calibration signals 77 are provided at frequencies higher than the carrier signal 75. Once the magnitude of the calibration signals 77 is known, these values can then be graphically displayed on the spectrum analyzer 61 so as to provide a greater measure of accuracy in determining the actual frequency of spurs or distortion products created by a unit under test 3. The processor 55 provides for automatic calibration of the test system without the operator needing to manually adjust the variable amplifier 15, low noise source 9, phase shifter 29 or low noise matching amplifier 43.

Typical noise measurement systems require manual adjustment of the amplifier 15, low noise source 9, phase shifter 29 and low noise matching amplifier 43. With reference again to FIG. 1, the noise measurement test system 1 of the present invention provides for automatic control of these components. Once calibrated, the noise measurement test system 1 initiates a test protocol, based upon instructions provided by a test operator through a keyboard or the like. The instructions from the test operator would typically include the frequency bandwidth through which the unit under test 3 will be tested, the number of offset frequencies needed for testing, the spacing of the offset frequencies, and the number of samples that must be conducted at each offset frequency. According to this test program, the processor 55 automatically adjusts the low noise source 9 through control link 69 to produce a carrier signal 39 at a predetermined frequency. As explained above, the carrier signal 39 is routed through the unit under test 3 wherein it produces a UUT signal 35 which is routed through amplifier 15 to mixer 21. Meanwhile, the low noise source 9 produces a second low noise signal 37 which is routed through phase shifter 29 before also reaching mixer 21. The mixer outputs the measurement test signal 41 which is routed though the analog-to-digital converter 49 to the processor 55. The processor 55 automatically adjusts the amplifier 15 through control link 67 so that the amplitude of the UUT signal 35 matches the amplitude of the second low noise signal 37 as received by mixer 21 through input port 25. The processor 55 also automatically adjusts the phase shifter 29 through control link 65 to adjust the phase of the second low noise signal 37 so that it is 90° out of phase from the UUT signal 35, placing the signals in phase quadrature at mixer 21. These adjustments are based upon an evaluation of the measurement test signal 41 as it reaches the processor 55. Where the low noise source 9, amplifier 15 or phase shifter 29 are not adjusted correctly, the processor 55 automatically sends a command through control links to the phase shifter 29, amplifier 15 or low noise source 9 making any necessary adjustments ensuring that the measurement test system operates to optimum levels. These adjustments are made without any operator manipulation. After leaving the mixer 21, the measurement test signal 41 is routed through the low noise matching amplifier 43 and analog-to-digital converter 49 to processor 55. Where there is improper impedance between the mixer 21 and analog-to-digital converter 49, the processor 55 automatically adjusts the low noise matching amplifier 43 to ensure that there is proper impendence. Similarly, where the measurement test signal 41 is of insufficient signal strength to make proper noise measurements, the processor 55 sends commands through control link 71 to the low noise matching amplifier 43 instructing the low noise matching amplifier 43 to amplify the gain of the measurement test signal 41. In this manner, the noise measurement test system of the present invention provides a completely automated testing system.

After reaching the processor 55, the measurement test signal 41 is routed to the spectrum analyzer 61. The measurement test signal 41, now in digital format as converted by the analog-to-digital convertor 49, is analyzed by the spectrum analyzer 61 using discreet fourier transforms that accurately measure the noise spectrum of the measurement test signal 41, as shown on FIG. 4. As explained above, the measurement test signal 41 will register as a DC signal, or zero signal, where there is no noise in the system or unit under test 3. However, where there is noise introduced by the unit under test, the measurement test signal 41 will appear on the spectrum analyzer 61 as an alternating current (AC), with the jitter representative of the noise caused by the unit under test. As understood by those skilled in the art, if there is phase noise of 1 kHz, then a spike will be displayed on the sweeping analyzer at 1 kHz according to the equation:

$$\Delta V(t) = V\text{peak} \sin \Delta \varnothing(t)$$

This is because there is a linear relationship between the mixer output 27 and the phase fluctuations of the unit under test 3. This is represented by the equation:

$$K\phi \Delta \varnothing = \Delta V$$

When a mixer 21 is used as a phase detector, the voltage output of the mixer is directly proportional to the phase fluctuations of the unit under test 3. For example, the phase fluctuations of 1 kHz will show up as a proportional amplitude frequency of 1 kHz on a spectrum analyzer according to the following equations:

$$\Delta V(fm) = K\phi \Delta \varnothing(fm)$$

$$\Delta V(fm) = 1.414 \, Vrms \Delta \varnothing(fm)$$

Similarly, the output voltage of the mixer 21, as a function of frequency measured on a spectrum analyzer 61, would be directly proportional to the input signal phase deviation according to the following equations:

$$\Delta V(t) = \pm \text{peak} \Delta \varnothing(t)$$

$$\Delta V(fm) = K\phi \Delta \varnothing(fm)$$

$$\Delta V(fm) = (\text{measured phase detector consultant}) \Delta \varnothing(fm)$$

$$\Delta \varnothing rms(fm) = (1/K\phi) \Delta Vrms \, (fm)$$

Simply, the greater the phase fluctuation, the greater in amplitude the noise signal will appear on the spectrum analyzer display. Moreover, one can distinguish a true spur from a noise related perturbation by changing the resolution bandwidth of the noise measurement test system. A spur will remain constant in amplitude as the resolution bandwidth is varied. In contrast, noise related perturbations will tend to change in amplitude as the resolution bandwidth is varied.

Once the above-described evaluation of the noise of the unit under test 3 has been completed at a particular frequency, for example by conducting a predetermined number of sample signal passes through the unit under test, the processor 55 automatically adjusts, "steps", the frequency of the low noise source 9 to a different offset level. The amplifier 15 and phase shifter 29 are also adjusted automatically by the processor 55 to maintain the signals received by the mixer 21 in phase quadrature and the low noise matching amplifier 43 is automatically adjusted to ensure sufficient signal gain and proper impendence between the mixer 21 and analog-to-digital converter 49. Additional evaluation of the measurement test signal 41 is then performed by the spectrum analyzer 61 at the new offset frequency. Preferably, testing is stepped across closely spaced frequencies across the band of interest as spurs or noise related perturbations may only manifest themselves at a particular offset frequency or frequencies.

Where the unit under test 3 is a variable amplifier 15, the unit under test 3 may produce spurs or noise perturbations at particular gain levels. Accordingly, in a preferred embodiment, the noise measurement test system 1 includes an additional control link 73 connecting the processor 55 to the unit under test 3. During a testing program, the unit under test 3 is also automatically adjusted by the processor 55 to various gain levels according to instructions by the test system operator.

Though the components of the noise measurement test system may be purchased by numerous companies known to those skilled in the art, amplifiers and low noise matching amplifiers from Microwave Solutions, Inc. of National City, Calif. are believed to be particularly suitable for application with the present invention due to their low noise characteristics. Similarly, phase shifters from KDI of Whippany, N.J. and mixers from Watkins-Johnson of Milpitas, Calif. are also believed acceptable for application with the present invention.

For purposes of practicing the present invention, acceptable software source code for controlling the processor of the noise measurement test system is provided below. This source code, provided in C++ uncompiled format, provides for measuring the characteristics of the measurement test signal. This source code does not provide for the graphical display of the measurement test signal on a video display, which could be determined by one skilled in the art without undo experimentation.

```
#include <analysis.h>
#include <ansi_c.h>
#include <cvirte.h>     /* Needed if linking in external compiler; harmless otherwise */
#include <userint.h>
#include "lois.h"
#include <windows .h>
#include <mmsystem.h>
#define ON 1
#define OFF 0
static int panelHandle;
double points[1024];
```

-continued

```
double noise[1000];
double upper_limit = 8;
double data[1000];
double phase;
double noise1[1000];
double upper_limit1;
double x[1000];
int go=0;
int child_1;
int main (int argc, char *argv[ ])
{
    if (InitCVIRTE (0, argv, 0) == 0) /* Needed if linking in external compiler;
harmless otherwise */
        return -1;   /* out of memory */
    if ((panelHandle = LoadPanel (0, "lois.uir", PANEL)) < 0)
        return -1;
    DisplayPanel (panelHandle);
    child_1 = LoadPanel (panelHandle, "lois.uir", CHILD_1);
    DisplayPanel (child_1);
    RunUserInterface 0;
    return 0;
}
   int CVICALLBACK AcquireData (int panel, int control, int event,
        void *callbackData, int eventData1, int eventData2)
{
    switch (event) {
        case EVENT_TIMER_TICK:
    SineWave(1024, 6.0, 28.18e-3, &phase, points);
    Spectrum(points, 256);
            GaussNoise (100, 3.0, -3.0, noise);
            Add1D (noise, points, 100, data);
            DeleteGraphPlot (panelHandle, PANEL_GRAPH, -1, 0);
            PlotY (panelHandle, PANEL_GRAPH, data, 100,
VAL_DOUBLE, VAL_THIN_LINE,
        VAL_EMPTY_SQUARE, VAL_SOLID, 1, VAL_RED);
            SineWave(512, 5, 10.18e-3, &phase, points);
            Spectrum(points, 128);
            PlotLine (panelHandle, PANEL_GRAPH_2, -10.0,
upper_limit, 100, upper_limit,
                            VAL_BLUE);
            DeleteGraphPlot (panelHandle, PANEL_GRAPH_2, -1, 1);
            PlotY (panelHandle, PANEL_GRAPH_2, points, 60,
VAL_DOUBLE, VAL_THIN_LINE,
        VAL_EMPTY_SQUARE, VAL_SOLID, 1, VAL_RED);
            PlotLine (panelHandle, PANEL_GRAPH, 0.0, upper_limit,
100, upper_limit,
                            VAL_BLUE);
            /* Check against alarm limits */
    if (data[15] >= upper_limit)
       SetCtrlVal (panelHandle, PANEL_ALARM_HIGH, ON);
    else
       SetCtrlVal (panelHandle, PANEL_ALARM_HIGH, OFF);
    SineWave(512, 5, 10.18e-3, &phase, points);
            Spectrum(points, 128);
    if (data[7] > upper_limit)
        SetCtrlVal (panelHandle, PANEL_LED, ON);
        else
       SetCtrlVal (panelHandle, PANEL_LED, OFF);
        if (data[15] > upper_limit)
        SetCtrlVal (panelHandle, PANEL_DISPLAYMSG1, "Fix U1 Amp");
        if (data[15] < upper_limit)
        SetCtrlVal (panelHandle, PANEL_DISPLAYMSG1, "Thata' Boy");
        if (data[7] > upper_limit)
            PlaySound("C:\\B2\\LO.WAV", NULL, SND_SYNC);
            SetCtrlVal (panelHandle, PANEL_DISPLAYMSG4, " Check
LO REF ");
        if (data[7] < upper_limit)
            SetCtrlVal (panelHandle, PANEL_DISPLAYMSG4, " ");
        if (data[0] > upper_limit)
            SetCtrlVal (panelHandle, PANEL_DISPLAYMSG5, "PM RES
fail");
        if (data[0] < upper_limit)
            SetCtrlVal (parielHandle, PANEL_DISPLAYMSG5, " ");
            if (data[7] > upper_limit)
            SetCtrlVal (panelHandle, PANEL_DISPLAYMSG6,
"CAUTION");
        if (data[7] < upper_limit)
            SetCtrlVal (panelHandle, PANEL_DISPLAYMSG6, " ");
            break;
```

-continued

```
      }
      return 0;
}
   int CVICALLBACK SetAlarms(int panel, int control, int event, void *callbackData,
int eventData1, int eventData2)
{
      if (event == EVENT_VAL_CHANGED)
         switch (control) {
            case PANEL_UPPER_LIMIT:
               GetCtrlVal (panelHandle, PANEL_UPPER_LIMIT, &upper_limit);
               break;
            }
      return 0;
}
      int CVICALLBACK FindMaxMin(int panel, int control, int event, void
*callbackData, int eventData1, int eventData2)
{
      double max, min;
      int max_index, min_index;
      switch (event) {
         case EVENT_COMMIT:
            MaxMin1D (points, 100, &max, &max_index, &min, &min_index);
            SetCtrlVal (panelHandle, PANEL_MAX, max);
            SetCtrlVal (panelHandle, PANEL_MIN, min);
                  YGraphPopup ("points", points, 100, VAL_DOUBLE);
            break;
         case EVENT_RIGHT_CLICK:
         MessagePopup ("Max & Min Control Help",
               "This control finds the maximum and minimum values of the waveform");
            break;
         }
      return(0);
}
int CVICALLBACK Image (int panel, int control, int event; void *callbackData, int
eventData1, int eventData2)
{
         switch (event) {
         case EVENT_COMMIT:
            DisplayImageFile (panelHandle, PANEL_PIC1, "lustl.bmp");
            break;
         }
      return 0;
}
   int CVICALLBACK Image2 (int panel, int control, int event, void *callbackData, int
eventData1, int eventData2)
{
      switch (event) {
         case EVENT_COMMIT:
            DisplayImageFile (panelHandle, PANEL_PIC1, "hatcher.bmp");
            break;
         }
      return 0;
}
int CVICALLBACK Image3 (int panel, int control, int event, void *callbackData, int
eventData1, int eventData2)
{
      switch (event) {
         case EVENT_COMMIT:
            DisplayImageFile (panelHandle, PANEL_PIC 1, "pan2.bmp");
            break;
         }
      return 0;
}
            int CVICALLBACK Comment(int panel, int control, int event, void
*callbackData, int eventData1, int eventData2)
{
      switch (event) {
         case EVENT_LEFT_CLICK:
         MessagePopup ("YOU'VE GOT A LOT OF NERVE !!!",
               "I'm calling your wife & boss buster . . . YOU are going to counciling . . I
don't listen to SUPERMAN . . so why should I listen to you . . .");
            break;
         }
      return 0;
}
int CVICALLBACK StopAcquireData (int panel, int control, int event,
            void *callbackData, int eventData1, int eventData2)
{
      switch (event) {
```

-continued

```
                case EVENT_COMMIT:
                            SuspendTimerCallbacks ( );
                            break;
            }
            return 0;
}
int CVICALLBACK StartAcquireData (int panel, int control, int event,
            void *callbackData, int eventData1, int eventData2)
{
    switch (event) {
        case EVENT_COMMIT:
                            ResumeTimerCallbacks ( );
                            break;
        }
        return 0;
}
int CVICALLBACK Show (int panel, int control, int event,
            void *callbackData, int eventData1, int eventData2)
{
    switch (event) {
        case EVENT_COMMIT:
                            HidePanel (child_1);
                            break;
        }
        return 0;
}
int CVICALLBACK Show1 (int panel, int control, int event,
            void *callbackData, int eventData1, int eventData2)
{
    switch (event) {
        case EVENT_COMMIT:
                            DisplayPanel (child_1);
                            break;
        }
        return 0;
}
int CVICALLBACK Shutdown (int panel, int control, int event,
            void *callbackData, int eventData1, int eventData2)
{
    switch (event) {
            case EVENT_COMMIT:
                    QuitUserInterface (0);
                    break;
        }
        return 0;
}
#include <cvirte.h>
#include "spectrum.h"
#include <ansi_c.h>
#include <analysis.h>
#include <dataacq.h>
#include <userint.h>
#include <utility.h>
#include <easyio.h>
static int helppnl;
static int displaymode = 0;
static double samprate = 20000.0;
static int points = 512;
static char channel[50] = "1";
static int board = 1;
static filtercode = 17;
static int running = 0;
static int mainpnl;
static int filterpnl;
static int scalepnl, daqpanel;
static int i;
static int scale;
static int datawindowtype;
static double rate;
static unsigned long task;
static unsigned long backlog;
static double waveform[2048];
static WindowConst constants;
static double freqspace;
static double spectrum[(2048 + 79)];
static double datawinplot[2048];
static int filterenable = 0;
static int filttype = 0;
static int iirtype = 0;
```

-continued

```
static int iirorder = 5;
static double iircutoff1 = 5000;
static double iircutoff2 = 8000;
static int filterfunc = 0;
static double passbndrip = .50;
static double stpbndatt = 40;
static int firfiltype = 0;
static int firwindow = 1;
static int firlength = 49;
static double fircutoff1 = 5000;
static double fircutoff2 = 8000;
static double kaiserbeta = 1.00;
static double filtcoefs[80];
static double filteredwave[(2048 + 79)];
static initial = 1;
static int daqpnl;
static int graphscalepnl;
static double waveformymin = -10.0;
static double waveformymax = 10.0;
static double spectrumlinmin = 0.0;
static double spectrumlinmax = 5.0;
static double spectrumdbmin = -200.0;
static double spectrumdbmax = 30.0;
static double spectrumdbmmin = -140.0;
static double spectrumdbmmax = 90.0;
static double timewavemin = -20.0;
static double timewavemax = 20.0;
static int signalswitch = 0;
static int simsignaltype = 0;
static double simsignalfreq = 2000.0;
static double simphase;
static short int errorchk = 0;
static short int boardcode;
static short int status = 0;
void myfoo(void);
int main (int argc, char *argv[ ])
{
    if (InitCVIRTE (0, argv, 0) = = 0) /* Needed if linking in external compiler;
harmless otherwise */
        return -1; /* out of memory */
    if ((graphscalepnl = LoadPanel (0, "spectrum.uir", SCALEPNL)) < 0)
        return -1;
    if ((helppnl = LoadPanel (0, "spectrum.uir", HELPPNL)) < 0)
        return -1;
    if ((daqpnl = LoadPanel (0, "spectrum.uir", DAQPANEL)) < 0)
        return -1;
    if ((filterpnl = LoadPanel (0, "spectrum.uir", FILTERPNL)) < 0)
        return -1;
    if ((mainpnl = LoadPanel (0, "spectrum.uir", MAINPNL)) < 0)
        return -1;
    for (i=0; i<points; i++)
    {
        datawinplot[i] = 1;
    }
    PlotY (mainpnl, MAINPNL_WINDOWGRAPH, datawinplot, points,
VAL_DOUBLE,
        VAL_THIN_LINE, VAL_EMPTY_SQUARE, VAL_SOLID, 1, VAL_RED);
    SetInputMode (daqpnl, DAQPANEL_SIGNALSWITCH, 1);
    DisplayPanel (mainpnl);
    RunUserInterface ( );
    return 0;
}
int CVICALLBACK Getdatawindow (int panel, int control, int event,
        void *callbackData, int eventData1, int eventData2)
{
    switch (event) {
        case EVENT_COMMIT:
            GetCtrlVal (mainpnl, MAINPNL_DATAWINDOW, &datawindowtype);
            switch (datawindowtype)
            {
                case 0:
                    for (i=0; i<points; i++)
                        datawinplot[i] = 1;
                    break;
                case 1:
                    for (i=0; i<points; i++)
                        datawinplot[i] = .5 - (.5*cos(2*3.14*i/points));
                    break;
                case 2:
```

-continued

```
            for (i=0; i<points; i++)
                datawinplot[i] = .54 - (.46*cos(2*3.14*i/points));
            break;
        case 3:
            for (i=0; i<points; i++)
                datawinplot[i] = .42323 - (.49755*cos(2*3.14*i/points)) +
(.07922*cos(4*3.14*i/points));
            break;
        case 4:
            for (i=0; i<points; i++)
                datawinplot[i] =
(7938.0/18608.0)-((9240.0/18608.0)*cos(2*3.14*i/points)) + ((1430.0/18608.0)*cos(4*
3.14*i/points));
            break;
        case 5:
            for (i=0; i<points; i++)
                datawinplot[i] =
.42-(.5*cos(2*3.14*i/points)) + (.08*cos(4*3.14*i/points));
            break;
        case 6:
            for (i=0; i<points; i++)
                datawinplot[i] =
.2810639-(.5208972*cos(2*3.14*i/points))+(.1980399*cos(4*3.14*i/points));
            break;
        case 7:
            for (i=0; i<points; i++)
                datawinplot[i] =
.42323-(.49755*cos(2*3.14*i/points))+(.07922*cos(4*3.14*i/points));
            break;
        case 8:
            for (i=0; i<points; i++)
                datawinplot[i]=
.42323-(.49755*cos(2*3.14*i/points))+(.07922*cos(4*3.14*i/points));
            break;
        }
        DeleteGraphPlot (mainpnl, MAINPNL_WINDOWGRAPH, -1,
VAL_DELAYED_DRAW);
        PlotY (mainpnl, MAINPNL_WINDOWGRAPH, datawinplot, points,
VAL_DOUBLE,
                VAL_THIN_LINE, VAL_EMPTY_SQUARE, VAL_SOLID, 1,
VAL_RED);
        break;
    case EVENT_RIGHT_CLICK:
        MessagePopup ("Data Window Selection",
            "Selects the window to be applied to the acquired signal.");
        break;
    }
    return 0;
}
int CVICALLBACK Getfilter (int panel, int control, int event,
        void *callbackData, int eventData1, int eventData2)
{
    switch (event) {
        case EVENT_COMMIT:
            DisplayPanel (filterpnl);
            break;
        case EVENT_RIGHT_CLICK:
            MessagePopup ("Set Filter Parameters",
                "Displays and allows changes to filter parameters.");
            break;
    }
    return 0;
}
int CVICALLBACK Start (int panel, int control, int event,
        void *callbackData, int eventData1, int eventData2)
{
    switch (event) {
        case EVENT_COMMIT:
            if (signalswitch = = 1) {
                AIClearAcquisition (task);
                AIStartAcquisition (board, channel, 2*points, samprate, 10, 0, &rate,
&task);
            }
            SetCtrlAttribute (mainpnl, MAINPNL_TIMER, ATTR_ENABLED, 1);
            SetInputMode(mainpnl, MAINPNL_START, 0);
            SetInputMode(mainpnl, MAINPNL_STOP, 1);
            running = 1;
            break;
        case EVENT_RIGHT_CLICK:
```

-continued

```
        MessagePopup ("Start Data Acquisition",
            "Begins signal acquisition and processing.");
        break;
    }
    return 0;
}
int CVICALLBACK Stop (int panel, int control, int event,
        void *callbackData, int eventData1, int eventData2)
{
    switch (event) {
        case EVENT_COMMIT:
            SetCtrlAttribute (mainpnl, MAINPNL_TIMER, ATTR_ENABLED, 0);
            SetInputMode(mainpnl, MAINPNL_START, 1);
            SetInputMode(mainpnl, MAINPNL_STOP, 0);
            running = 0;
            break;
        case EVENT_RIGHT_CLICK:
            MessagePopup ("Stop Data Acquisition",
                "Disables signal acquisition and processing.");
            break;
    }
    return 0;
}
int CVICALLBACK Quit (int panel, int control, int event,
        void *callbackData, int eventData1, int eventData2)
{
    switch (event) {
        case EVENT_COMMIT:
            QuitUserInterface (0);
            break;
        case EVENT_RIGHT_CLICK:
            MessagePopup ("Quit",
                "Quits the program.");
            break;
    }
    return 0;
}
int CVICALLBACK Getscale (int panel, int control, int event,
        void *callbackData, int eventData1, int eventData2)
{
    switch (event) {
        case EVENT_COMMIT:
            GetCtrlVal (mainpnl, MAINPNL_SCALE, &scale);
            break;
        case EVENT_RIGHT_CLICK:
            MessagePopup ("Set Axis",
                "Sets the axis on the frequency graph to linear, dB, or dBm.");
            break;
    }
    return 0;
}
/* filtercoefs array. The power spectrum of the filtered wave */
int CVICALLBACK Getdata (int panel, int control, int event,
        void *callbackData, int eventData1, int eventData2)
{
    switch (event) {
        case EVENT_TIMER_TICK:
            if (signalswitch = = 0) {
                switch (simsignaltype) {
                    case 0:
                        SineWave (points, 5.0, (simsignalfreq/20000.0), &simphase,
waveform);
                        break;
                    case 1:
                        SquareWave (points, 5.0, (simsignalfreq/20000.0), &simphase, 50.0,
                            waveform);
                        break;
                    case 2:
                        TriangleWave (points, 5.0, (simsignalfreq/20000.0), &simphase,
                            waveform);
                        break;
                    case 3:
                        Impulse (points, 100.0, 0, waveform);
                        break;
                }
            }
            else {
                status = AIReadAcquisition (task, points, LATEST_MODE,
&backlog,GROUP_BY_CHANNEL, waveform);
```

-continued

```
        if (abs(status) = = 10846) {
            SetCtrlAttribute (mainpnl, MAINPNL_TIMER, ATTR_ENABLED, 0);
                MessagePopup ("DAQ Error",
                    "The sampling rate you have selected is too large for your
computer. Data in the buffer is being overwritten. Please change your sampling rate
to a lower value.");
                DisplayPanel (daqpnl);
            }
        }
        DeleteGraphPlot (mainpnl, MAINPNL_TIMEGRAPH, -1,
VAL_DELAYED_DRAW);
        SetAxisRange (mainpnl, MAINPNL_TIMEGRAPH, VAL_NO_CHANGE,
0.0, 1.0,
                    VAL_MANUAL, waveformymin, waveformymax);
        PlotY (mainpnl, MAINPNL_TIMEGRAPH, waveform, points,
VAL_DOUBLE,
                VAL_THIN_LINE, VAL_EMPTY_SQUARE, VAL_SOLID, 1,
VAL_RED);
        ProcessDrawEvents ( );
        ScaledWindow (waveform, points, datawindowtype, &constants);
        if (filterenable = = 0) {
            AutoPowerSpectrum (waveform, points, (1/samprate), spectrum,
                    &freqspace);
            DeleteGraphPlot (mainpnl, MAINPNL_FREQGRAPH, -1,
VAL_DELAYED_DRAW);
            if (displaymode = = 0) {
            switch (scale) {
                case 0:
                    SetAxisRange (mainpnl, MAINPNL_FREQGRAPH,
VAL_NO_CHANGE, 0.0, 1.0,
(simsignaltype = = 3)? VAL_AUTOSCALE:VAL_MANUAL, spectrumlinmin,
spectrumlinmax);
                    break;
                case 1:
                    for (i=0; i<(points/2); i++) {
                        spectrum[i] = 20*(log10(spectrum[i]));
                    }
                    SetAxisRange (mainpnl, MAINPNL_FREQGRAPH,
VAL_NO_CHANGE, 0.0, 1.0,
(simsignaltype = = 3)?VAL_AUTOSCALE:VAL_MANUAL, spectrumdbmin,
spectrumdbmax);
                    break;
                case 2:
                    for (i=0; i<(points/2); i++) {
                        spectrum[i] = 20*(log10(spectrum[i]/.001));
                    }
                    SetAxisRange (mainpnl, MAINPNL_FREQGRAPH,
VAL_NO_CHANGE, 0.0, 1.0,
(simsignaltype = = 3)?VAL_AUTOSCALE:VAL_MANUAL, spectrumdbmmin,
spectrumdbmmax);
                    break;
            }
            PlotWaveform (mainpnl, MAINPNL_FREQGRAPH, spectrum, points/2,
                    VAL_DOUBLE, 1.0, 0.0, 0.0, freqspace, VAL_THIN_LINE
                    VAL_EMPTY_SQUARE, VAL_SOLID, 1, VAL_RED);
            }
            else{
                SetAxisRange (mainpnl, MAINPNL_FREQGRAPH,
VAL_AUTOSCALE, 0.0, 1.0,
                    VAL_MANUAL, timewavemin, timewavemax);
                PlotY (mainpnl, MAINPNL_FREQGRAPH, waveform, points,
VAL_DOUBLE,
                    VAL_THIN_LINE, VAL_EMPTY_SQUARE, VAL_SOLID 1,
VAL_RED);
            }
        }
        else {
            switch (filtercode) {
                case 1: /* LP BUTTERWORTH IIR */
                    Bw_LPF (waveform, points, samprate, iircutoff1, iirorder,
                        filteredwave);
                    break;
                case 2: /* HP BUTTERWORTH IIR */
                    Bw_HPF (waveform, points, samprate, iircutoff1, iirorder,
                        filteredwave);
                    break;
                case 3: /* BP BUTTERWORTH IIR */
                    *Bw_BPF (waveform, points, samprate, iircutoff1, iircutoff2, iirorder,
                        filteredwave);
```

```
                    break;
                case 4: /* BS BUTTERWORTH IIR */
                    Bw_BSF (waveform, points, samprate, iircutoff1, iircutoff2, iirorder,
                        filteredwave);
                    break;
                case 5: /* LP CHEBYSHEV IIR */
                    Ch_LPF (waveform, points, samprate, iircutoff1, passbndrip,
iirorder,
                        filteredwave);
                    break;
                case 6: /* HP CHEBYSHEV IIR */
                    Ch_HPF (waveform, points, samprate, iircutoff1, passbndrip,
iirorder,
                        filteredwave);
                    break;
                case 7: /* BP CHEBYSHEV IIR */
                    Ch_BPF (waveform, points, samprate, iircutoff1, iircutoff2,
                        passbndrip, iirorder, filteredwave);
                    break;
                case 8: /* BS CHEBYSHEV IIR */
                    Ch_BSF (waveform, points, samprate, iircutoff1; iircutoff2,
                        passbndrip, iirorder, filteredwave);
                    break;
                case 9: /* LP INVERSE CHEBYSHEV IIR */
                    InvCh_LPF (waveform, points, samprate, iircutoff1, stpbndatt,
                        iirorder, filteredwave);
                    break;
                case 10: /* HP INVERSE CHEBYSHEV IIR */
                    InvCh_HPF (waveform; points, samprate, iircutoff1, stpbndatt,
                        iirorder, filteredwave);
                    break;
                case 11: /* BP INVERSE CHEBYSHEV IIR */
                    InvCh_BPF (waveform, points, samprate, iircutoff1, iircutoff2,
                        stpbdatt, iirorder, filteredwave);
                    break;
                case 12: /* BS INVERSE CHEBYSHEV IIR */
                    InvCh_BSF (waveform, points, samprate, iircutoff1, iircutoff2,
                        stpbndatt, iirorder, filteredwave);
                    break;
                case 13: /* LP ELLIPTIC IIR */
                    Elp_LPF (waveform, points, samprate, iircutoff1, passbndrip,
                        stpbdatt, iirorder, filteredwave);
                    break;
                case 14: /* HP ELLIPTIC IIR */
                    Elp_HPF (waveform, points, samprate, iircutoff1, passbndrip,
                        stpbdatt, iirorder, filteredwave);
                    break;
                case 15: /* BP ELLIPTIC IIR */
                    Elp_BPF (waveform, points, samprate, iircutoff1, iircutoff2,
                        passbndrip, stpbndatt, iirorder, filteredwave);
                    break;
                case 16: /* BS ELLIPTIC IIR */
                    Elp_BSF (waveform, points, samprate, iircutoff1, iircutoff2,
                        passbndrip, stpbndatt, iirorder, filteredwave);
                    break;
                case 17: /* LP WINDOW FIR */
                    Wind_LPF (samprate, fircutoff1, firlength, filtcoefs, firwindow);
                    Convolve (filtcoefs, firlength, waveform, points, filteredwave);
                    break;
                case 18: /* HP WINDOW FIR */
                    Wind_HPF (samprate, fircutoff1, firlength, filtcoefs, firwindow);
                    Convolve (filtcoefs, firlength, waveform, points, filteredwave);
                    break;
                case 19: /* BP WINDOW FIR */
                    Wind_BPF (samprate, fircutoff1, fircutoff2, firlength, filtcoefs,
firwindow);
                    Convolve (filtcoefs, firlength, waveform, points, filteredwave);
                    break;
                case 20: /* BS WINDOW FIR */
                    Wind_BSF (samprate, fircutoff1, fircutoff2, firlength,
filtcoefs,firwindow);
                    Convolve (filtcoefs, firlength,waveform,points, filteredwave);
                    break;
                case 21: /* LP KAISER FIR */
                    Ksr_LPF (samprate, fircutoff1, firlength, filtcoefs, kaiserbeta);
                    Convolve (filtcoefs, firlength, waveform, points, filteredwave);
                    break;
                case 22: /* HP KAISER FIR */
                    Ksr_HPF (samprate, fircutoff1, firlength, filtcoefs, kaiserbeta);
```

-continued

```
            Convolve (filtcoefs, firlength, waveform, points, filteredwave);
            break;
        case 23: /* BP KAISER FIR */
            Ksr_BPF (samprate, fircutoff1, fircutoff2, firlength, filtcoefs,
kaiserbeta);
            Convolve (filtcoefs, firlength, waveform, points, filteredwave);
            break;
        case 24: /* BS KAISER FIR */
            Ksr_BSF (samprate, fircutoff1, fircutoff2, firlength; filtcoefs,
kaiserbeta);
            Convolve (filtcoefs,firlength, waveform, points, filteredwave);
            break;
        }
        AutoPowerSpectrum (filteredwave, points, (1/samprate), spectrum,
            &freqspace);
        DeleteGraphPlot (mainpnl, MAINPNL_FREQGRAPH, -1,
VAL_DELAYED_DRAW);
        if (displaymode = = 0) {
            switch (scale) {
            case 0:
                SetAxisRange (mainpnl, MAINPNL_FREQGRAPH,
VAL_NO_CHANGE, 0.0, 1.0,
(simsignaltype = = 3)?VAL_AUTOSCALE:VAL_MANUAL, spectrumlinmin,
spectrumlinmax);
                break;
            case 1:
                for (i=0; i<(points/2); i++) {
                    spectrum[i] = 20*(log10(spectrum[i])) ;
                }
                SetAxisRange (mainpnl, MAINPNL_FREQGRAPH,
VAL_NO_CHANGE, 0.0, 1.0,
(simsignaltype = = 3)?VAL_AUTOSCALE:VAL_MANUAL, spectrumdbmin,
spectrumdbmax);
                break;
            case 2:
                for (i=0; i<(points/2); i++) {
                    spectrum[i] = 20*(log10(spectrum[i]/:001));
                }
                SetAxisRange (mainpnl, MAINPNL_FREQGRAPH,
VAL_NO_CHANGE, 0.0, 1.0,
(simsignaltype = = 3)?VAL_AUTOSCALE:VAL_MANUAL, spectrumdbmmin,
spectrumdbmmax);
                break;
            }
            PlotWaveform (mainpnl, MAINPNL_FREQGRAPH, spectrum,
points/2,
                VAL_DOUBLE, 1.0, 0.0, 0.0, freqspace,
VAL_THIN_LINE,
                VAL_EMPTY_SQUARE, VAL_SOLID, 1, VAL_RED);
        }
        else {
            SetAxisRange (mainpnl, MAINPNL_FREQGRAPH,
VAL_AUTOSCALE, 0.0, 1.0,
                VAL_MANUAL, timewavemin, timewavemax);
            PlotY (mainpnl, MAINPNL_FREQGRAPH, filteredwave, points,
VAL_DOUBLE,
                VAL_THIN_LINE, VAL_EMPTY_SQUARE, VAL_SOLID, 1,
VAL_RED);
        }
        }
        break;
    }
    return 0;
}
void SetFilterPnlInputModes(char * charArray)
{
    SetInputMode (filterpnl, FILTERPNL_FILTTYPE, charArray[0] = = '1');
    SetInputMode (filterpnl, FILTERPNL_IIRTYPE, charArray[1] = = '1');
    SetInputMode (filterpnl, FILTERPNL_IIRORDER, charArray[2] = = '1');
    SetInputMode (filterpnl, FILTERPNL_IIRCUTOFF1 charArray[3] = = '1');
    SetInputMode (filterpnl, FILTERPNL_IIRCUTOFF2, charArray[4] = = '1');
    SetInputMode (filterpnl, FILTERPNL_FILTERFUNC, charArray[5] = = '1');
    SetInputMode (filterpnl, FILTERPNL_PASSBNDRIP, charArray[6] = = '1');
    SetInputMode (filterpnl, FILTERPNL_STPBNDATT, charArray[7] = = '1');'1');
    SetInputMode (filterpnl, FILTERPNL_FIRFILTYPE, charArray[8] = = '1');
    SetInputMode (filterpnl, FILTERPNL_FIRWINDOW, charArray[9] = = '1');
    SetInputMode (filterpnl, FILTERPNL_FIRLENGTH, charArray[10] = = '1');
    SetInputMode (filterpnl, FILTERPNL_FIRCUTOFF1, charArray[11] = = '1');
    SetInputMode (filterpnl, FILTERPNL_FIRCUTOFF2, charArray[12] = = '1');
```

-continued

```
      SetInputMode (filterpnl, FILTERPNL_KAISERBETA, charArray[13] = = '1');
}
int CVICALLBACK Enablefilters (int panel, int control, int event,
        void *callbackData, int eventData1, int eventData2)
{
    switch (event) {
      case EVENT_COMMIT:
        GetCtrlVal (filterpnl, FILTERPNL_FILTERENABLE, &filterenable);
        if (filterenable = = 0)
          SetFilterPnlInputModes ("00000000000000");
        else if ((filterenable = = 1) &&: (initial = = 1))
        {
          initial = 0;
          SetFilterPnlInputModes ("10000100111100");
        }
        else
        {
          switch (filttype) {
            case 0:
              switch (firfiltype) {
                case 0:
                  switch (filterfunc) {
            case 0:
              SetFilterPnlInputModes("10000100111100");
              break;
            case 1:
              SetFilterPnlInputModes("10000100111100");
              break;
            case 2:
              SetFilterPnlInputModes("10000100111110");
              break;
            case 3:
              SetFilterPnlInputModes("10000100111110");
              break;
          }
          break;
        case 1:
          switch (filterfunc) {
            case 0:
              SetFilterPnlInputModes("10000100101101");
              break;
            case 1:
              SetFilterPnlInputModes("10000100101101");
              break;
            case 2:
              SetFilterPnlInputModes("10000100101111");
              break;
            case 3:
              SetFilterPnlInputModes("10000100101111");
              break;
          }
          break;
        }
        break;
      case 1:
        switch (iirtype) {
          case 0:
            switch (filterfunc) {
              case 0:
                SetFilterPnlInputModes("11110100000000");
                break;
              case 1:
                SetFilterPnlInputModes("11110100000000");
                break;
              case 2:
                SetFilterPnlInputModes("11111100000000");
                break;
              case 3:
                SetFilterPnlInputModes("11111100000000");
                break;
            }
            break;
          case 1:
            switch (filterfunc) {
              case 0:
                SetFilterPnlInputModes("11110110000000");
                break;
              case 1:
                SetFilterpnHnputModes("11110110000000");
```

```
                    break;
                case 2:
                    SetFilterpnlInputModes("11111110000000");
                    break;
                case 3:
                    SetFilterPnlInputModes("11111110000000");
                    break;
                }
                break;
            case 2:
                switch (filterfunc) {
                case 0:
                    SetFilterPnlInputModes("111110101000000");
                    break;
                case 1:
                    SetFilterPnlInputModes("11110101000000");
                    break;
                case 2:
                    SetFilterPnlInputModes("11111101000000");
                    break;
                case 3:
                    SetFilterPnlInputModes("11111101000000");
                    break;
                }
                break;
            case 3:
                switch (filterfunc) {
                case 0:
                    SetFilterPnlInputModes("11110111000000");
                    break;
                case 1:
                    SetFilterPnlInputModes("111101110000000");
                    break;
                case 2:
                    SetFilterPnlInputModes("11111111000000");
                    break;
                case 3:
                    SetFilterPnlInputModes("11111111000000");
                    break;
                }
                break;
            }
        }
        break;
    case EVENT_RIGHT_CLICK:
        MessagePopup ("Enable/Disable Filters",
            "Enables or disables filtering of the acquired signal.");
        break;
    }
    return 0;
}
int CVICALLBACK Getfiltype (int panel, int control, int event,
        void *callbackData, int eventData1, int eventData2)
{
    switch (event) {
        case EVENT_COMMIT:
            GetCtrlVal (filterpnl, FILTERPNL_FILTTYPE, &filttype);
            switch (filttype) {
                case 0: /* FIR */
                    switch (firfiltype) {
                        case 0: /* WINDOW */
                            switch (filterfunc) {
                            case 0: /* LOWPASS */
                                filtercode = 17; /* LP WINDOW FIR */
                                break;
                            case 1: /* HIGHPASS */
                                filtercode = 18; /* HP WINDOW FIR */
                                SetFilterPnlInputModes("10000100111100");
                                break;
                            case 2: /* BANDPASS */
                                filtercode = 19; /* BP WINDOW FIR */
                                SetFilterPnlInputModes("10000100111110");
                                break;
                            case 3: /* BANDSTOP */
                                filtercode = 20; /* BS WINDOW FIR */
                                SetFilterPnlInputModes("10000100111110");
                                break;
```

```
        }
        break;
    case 1: /* KAISER */
        switch (filterfunc) {
            case 0: /* LOWPASS */
                filtercode = 21; /* LP KAISER FIR */
                SetFilterPnlInputModes("10000100101101");
                break;
            case 1: /* HIGHPASS */
                filtercode = 22; /* HP KAISER FIR */
                SetFilterPnlInputModes("10000100101101");
                break;
            case 2: /* BANDPASS */
                filtercode = 23; /* BP KAISER FIR */
                SetFilterPnlInputModes("10000100101111");
                break;
            case 3: /* BANDSTOP */
                filtercode = 24; /* BS KAISER FIR */
                SetFilterPnlInputModes("10000100101111");
                break;
        }
        break;
    }
    break;
case 1: /* IIR */
    switch (iirtype) {
        case 0: /* BUTTERWORTH */
            switch (filterfunc) {
                case 0: /* LOWPASS */
                    filtercode = 1; /* LP BUTTERWORTH IIR */
                    SetFilterpnlInputModes("11110100000000");
                    break;
                case 1: /* HIGHPASS */
                    filtercode = 2; /* HP BUTTERWORTH IIR */
                    SetFilterpnlInputModes("11110100000000");
                    break;
                case 2: /* BANDPASS */
                    filtercode = 3; /* BP BUTTERWORTH IIR */
                    SetFilterPnlInputModes("11111100000000");
                    break;
                case 3: /* BANDSTOP */
                    filtercode = 4; /* BS BUTTERWORTH IIR */
                    SetFilterPnlInputModes("11111100000000");
                    break;
            }
            break;
        case 1: /* CHEBYSHEV */
            switch (filterfunc) {
                case 0: /* LOWPASS */
                    filtercode = 5; /* LP CHEBYSHEV IIR */
                    SetFilterPnlInputModes("11110110000000");
                    break;
                case 1: /* HIGHPASS */
                    filtercode = 6; /* HP CHEBYSHEV IIR */
                    SetFilterPnlInputModes("111101100000000");
                    break;
                case 2: /* BANDPASS */
                    filtercode = 7; /* BP CHEBYSHEV IIR */
                    SetFilterPnlInputModes("11111110000000");
                    break;
                case 3: /* BANDSTOP */
                    filtercode = 8; /* BS CHEBYSHEV IIR */
                    SetFilterPnlInputModes("11111110000000");
                    break;
            }
            break;
        case 2: /* INV CHEBYSHEV */
            switch (filterfunc) {
                case 0: /* LOWPASS */
                    filtercode = 9; /* LP INV CHEBYSHEV IIR */
                    SetFilterPnlInputModes("11110101000000");
                    break;
                case 1: /* HIGHPASS */
                    filtercode = 10; /* HP INV CHEBYSHEV */
                    SetFilterpnlInputModes("11110101000000");
                    break;
                case 2: /* BANDPASS */
                    filtercode = 11; /* BP INVERSE CHEBYSHEV */
                    SetFilterPnlInputModes("11111101000000");
```

```
                    break;
                case 3: /* BANDSTOP */
                    filtercode = 12; /* BS INV CHEBYSHEV IIR */
                    SetFilterpnlInputModes("11111101000000");
                    break;
                }
                break;
            case 3: /* ELLIPTIC */
                switch (filterfunc) {
                case 0: /* LOWPASS */
                    filtercode = 13; /* LP ELLIPTIC IIR */
                    SetFilterPn.lInputModes("11110111000000");
                    break;
                case 1: /* HIGHPASS */
                    filtercode = 14; /* HP ELLIPTIC IIR */
                    SetFilterPnlInputModes("11110111000000");
                    break;
                case 2: /* BANDPASS */
                    filtercode = 15; /* BP ELLIPTIC IIR */
                    SetFilterPnlInputModes("11111111000000");
                    break;
                case 3: /* BANDSTOP */
                    filtercode = 16; /* BS ELLIPTIC IIR
                    SetFilterPnlInputModes("11111111000000");
                    break;
                } /* END OF SWITCH ON FILTERFUNC */
                break;
            } /* END OF SWITCH ON IIRTYPE */
            break;
        } /* END OF SWITCH ON FILTTYPE */
        break;
    case EVENT_RIGHT_CLICK:
        MessagePopup ("Select Filter Type",
            "Selects between IIR and FIR filters.");
        break;
    } /* END OF SWITCH ON COMMIT */
    return 0;
} /* END OF FUNCTION */
int CVICALLBACK Getiirtype (int panel, int control, int event,
        void *callbackData, int eventData1, int eventData2)
{
    switch (event) {
    case EVENT_COMMIT:
        GetCtrlVal (filterpnl, FILTERPNL_IIRTYPE, &iirtype);
        switch (iirtype) {
        case 0: /* BUTTERWORTH */
            switch (filterfunc) {
            case 0: /* LOWPASS */
                filtercode = 1; /* LP BUTTERWORTH IIR */
                SetFilterPnlInputModes("11110100000000");
                break;
            case 1: /* HIGHPASS */
                filtercode = 2; /* HP BUTTERWORTH IIR */
                SetFilterPnlInputModes("11110100000000");
                break;
            case 2: /* BANDPASS */
                filtercode = 3; /* BP BUTTERWORTH IIR */
                SetFilterPnlInputModes("11111100000000");
                break;
            case 3: /* BANDSTOP */
                filtercode = 4; /* BS BUTTERWORTH IIR */
                SetFilterPnlInputModes("11111100000000");
                break;
            }
            break;
        case 1: /* CHEBYSHEV */
            switch (filterfunc) {
            case 0: /* LOWPASS */
                filtercode = 5; /* LP CHEBYSHEV IIR */
                SetFilt&PnlInputModes("111101100000000");
                break;
            case 1: /* HIGHPASS */
                filtercode = 6; /* HP CHEBYSHEV IIR */
                SetFilterpn:lInputModes("11110110000000");
                break;
            case 2: /* BANDPASS */
                filtercode = 7; /* BP CHEBYSHEV IIR */
                SetFilterPnlInputModes("11111110000000");
                break;
```

-continued

```
                case 3: /* BANDSTOP */
                    filtercode = 8; /* BS CHEBYSHEV IIR */
                    SetFilterPnlInputModes("11111110000000");
                    break;
            }
            break;
        case 2: /* INV CHEBYSHEV */
            switch (filterfunc) {
                case 0: /* LOWPASS */
                    filtercode = 9; /* LP INV CHEBYSHEV IIR */
                    SetFilterPnlInputModes("11110101000000");
                    break;
                case 1: /* HIGHPASS */
                    filtercode = 10; /* HP INV CHEBYSHEV IIR */
                    SetFilterPnlInputModes("11110101000000");
                    break;
                case 2: /* BANDPASS */
                    filtercode = 11; /* BP INVERSE CHEBYSHEV */
                    SetFilterPnlInputModes("11111101000000");
                    break;
                case 3: /* BANDSTOP */
                    filtercode = 12; /* BS INV CHEBYSHEV IIR */
                    SetFilterPnlInputModes ("11111101000000");
                    break;
            }
            break;
        case 3: /* ELLIPTIC */
            switch (filterfunc) {
                case 0: /* LOWPASS */
                    filtercode = 13; /* LP ELLIPTIC IIR */
                    SetFilterPnlInputModes("11110111000000");
                    break;
                case 1: /* HIGHPASS */
                    filtercode = 14; /* HP ELLIPTIC IIR */
                    SetFilterPnlInputModes("11110111000000");
                    break;
                case 2: /* BANDPASS */
                    filtercode = 15; /* BP ELLIPTIC IIR */
                    SetFilterPnlInputModes("11111111000000");
                    break;
                case 3: /* BANDSTOP */
                    filtercode = 16; /* BS ELLIPTIC IIR */
                    SetFilterPnlInputModes("11111111000000");
                    break;
            } /* END OF SWITCH ON FILTERFUNC */
            break;
        } /* END OF SWITCH ON IIRTYPE */
        break;
    case EVENT_RIGHT_CLICK:
        MessagePopup ("Select IIR Filter Type",
            "Select between Butterworth, Chebyshev, Inverse Chebyshev, or
Elliptic IIR Filters.");
        break;
    } /* END OF SWITCH ON COMMIT */
    return 0;
} /* END OF FUNCTION */
void CheckCutoffs (void)
{
    if ((filterenable = = 1) && (filttype = = 0) && ((filterfunc = = 2) ||
(filterfunc = = 3))) {
        if (fircutoff2 < = fircutoff1) {
        MessagePopup ("FIR Cutoff Frequency Error",
            "The upper cutoff frequency must be greater than the lower cutoff
frequency. The upper cutoff frequency has been reset to 100 Hz greater than the lower
cutoff frequency.");
        if (fircutoff1 = = (samprate/2)) {
            fircutoff1 = fircutoff1 - 100;
            SetCtrlVal (filterpnl, FILTERPNL_FIRCUTOFF1, fircutoff1);
            }
        fircutoff1 = fircutoff1 + 100;
        SetCtrlVal (filterpnl, FILTERPNL_FIRCUTOFF2, fircutoff2);
        }
    }
    if ((filterenable = = 1) && (filttype = = 1) && ((filterfunc = = 2) ||
(filterfunc= = 3))) {
        if (iircutoff2 < = iircutoff1) {
        MessagePopup ("IIR Cutoff Frequency Error",
            "The upper cutoff frequency must be greater than the lower cutoff
frequency. The upper cutoff frequency has been reset to 100 Hz greater than the lower
```

-continued

```
cutoff frequency.");
        if (iircutoff1 = = (samprate/2)) {
           iircutoff1 = iircutoff1 - 100;
           SetCtrlVal (filterpnl, FILTERPNL_IIRCUTOFF1, iircutoff1);
           }
        iircutoff2 = iircutoff1 + 100;
        SetCtrlVal (filterpnl; FILTERPNL_IIRCUTOFF2, iircutoff2);
        }
     }
}
int CVICALLBACK Getiirorder (int panel, int control, int event,
      void *callbackData, int eventData1, int eventData2)
{
    switch (event) {
      case EVENT_COMMIT:
        GetCtrlVal (filterpnl, FILTERPNL_IIRORDER, &iirorder);
        break;
      case EVENT_RIGHT_CLICK:
        MessagePopup ("Set IIR Filter Order",
            "Sets the order of the IIR Filter.");
        break;
      }
      return 0;
}
int CVICALLBACK Getfircutoff1 (int panel, int control, int event,
      void *callbackData, int eventData1, int eventData2)
{
    switch (event) {
      case EVENT_COMMIT:
        GetCtrlVal (filterpnl, FILTERPNL_FIRCUTOFF1, &fircutoff1);
        CheckCutoffs( );
        break;
      case EVENT_RIGHT_CLICK:
        MessagePopup ("Set Lower FIR Cutoff Frequency",
            "Sets the lower cutoff frequency of the FIR filter (in Hertz). This is
the only cutoff frequency for Lowpass and Highpass filters.");
        break;
      }
      return 0;
}
int CVICALLBACK Getfircutoff1 (int panel, int control, int event,
      void *callbackData, int eventData1, int eventData2)
{
    switch (event) {
      case EVENT_COMMIT:
        GetCtrlVal (filterpnl, FILTERPNL_FIRCUTOFF1, &fircutoff1);
        CheckCutoffs( );
        break;
      case EVENT RIGHT_CLICK:
        MessagePopup ("Set Lower IIR Cutoff Frequency",
            "Sets the lower cutoff frequency of the IIR filter (in Hertz). This is
the only cutoff frequency for Lowpass and Highpass filters.");
        break;
      }
      return 0;
}
int CVICALLBACK Getfircutoff2 (int panel, int control, int event,
      void *callbackData, int eventData1, int eventData2)
{
    switch (event) {
      case EVENT_COMMIT:
        GetCtrlVal (filterpnl, FILTERPNL_FIRCUTOFF2, &fircutoff2);
        CheckCutoffs( );
        break;
      case EVENT_RIGHT_CLICK:
        MessagePopup ("Set Upper FIR Cutoff Frequency",
            "Sets the upper cutoff frequency of the FIR filter (in Hertz). This is
used only with Bandpass and Bandstop filters.");
        break;
      }
      return 0;
}
int CVICALLBACK Getiircutoff2 (int panel, int control, int event,
      void *callbackData, int eventData1, int eventData2)
{
    switch (event) {
      case EVENT_COMMIT:
        GetCtrlVal (filterpnl, FILTERPNL_IIRCUTOFF2, &iircutoff2);
        CheckCutoffs( );
```

```
                break;
            case EVENT_RIGHT_CLICK:
                MessagePopup ("Set Upper IIR Cutoff Frequency",
                    "Sets the upper cutoff frequency of the IIR filter (in Hertz). This is
used only with Bandpass and Bandstop filters.");
                break;
        }
        return 0;
}
int CVICALLBACK Getpassbndrip (int panel, int control, int event,
        void *callbackData, int eventData1, int eventData2)
{
    switch (event) {
        case EVENT_COMMIT:
            GetCtrlVal (filterpnl, FILTERPNL_PASSBNDRIP, &passbndrip);
            break;
        case EVENT_RIGHT_CLICK:
            MessagePopup ("Select Ripple",
                "Sets the value (in dB) of ripple in the passband for Chebyshev and
Elliptic filters.");
            break;
    }
    return 0;
}
int CVICALLBACK Getstpbndatt (int panel, int control, int event,
        void *callbackData, int eventData1, int eventData2)
{
    switch (event) {
        case EVENT_COMMIT:
            GetCtrlVal (filterpnl, FILTERPNL_STPBNDATT, &stpbndatt);
            break;
        case EVENT_RIGHT_CLICK:
            MessagePopup ("Select Attenuation",
                "Sets the value (in dB) of attenuation in the stopband for Inverse
Chebyshev and Elliptic filters.");
            break;
    }
    return 0;
}
int CVICALLBACK Getfirfiltype (int panel, int control, int event,
        void *callbackData, int eventData1, int eventData2)
{
    switch (event) {
        case EVENT_COMMIT:
            GetCtrlVal (filterpnl, FILTERPNL_FIRFILTYPE, &firfiltype);
            switch (firfiltype) {
                case 0: /* WINDOW */
                    switch (filterfunc) {
                        case 0: /* LOWPASS */
                            filtercode = 17; /* LP WINDOW FIR */
                            SetFilterPnlInputModes("10000100111100");
                            break;
                        case 1: /* HIGHPASS */
                            filtercode = 18; /* FIP WINDOW FIR */
                            SetFilterPnlInputModes("10000100111100");
                            break;
                        case 2: /* BANDPASS */
                            filtercode = 19; /* BP WINDOW FIR */
                            SetFilterPnlInputModes("10000100111110");
                            break;
                        case 3: /* BANDSTOP */
                            filtercode = 20; /* BS WINDOW FIR */
                            SetFilterPnlInputModes("10000100111110");
                            break;
                    }
                    break;
                case 1: /* KAISER */
                    switch (filterfunc) {
                        case 0: /* LOWPASS */
                            filtercode = 21; /* LP KAISER FIR */
                            SetFilterPnlInputModes("10000100101101");
                            break;
                        case 1: /* HIGHPASS */
                            filtercode = 22; /* HP KAISER FIR */
                            SetFilterPnlInputModes("10000100101101");
                            break;
                        case 2: /* BANDPASS */
                            filtercode = 23; /* BP KAISER FIR */
                            SetFilterPnlInputModes("10000100101111");
```

-continued

```
                    break;
                case 3: /* BANDSTOP */
                    filtercode = 24; /* BS KAISER FIR */
                    SetFilterPnlInputModes("10000100101111");
                    break;
                }
            break;
        } /* END OF SWITCH ON FIRFILTYPE */
        break;
    case EVENT_RIGHT_CLICK:
        MessagePopup ("Select FIR Filter Type",
            "Sets type of FIR filter used (Window or Kaiser methods).");
        break;
    } /* END OF SWITCH ON COMMIT */
    return 0;
} /* END OF FUNCTION */
int CVICALLBACK Getfirwindow (int panel, int control, int event,
      void *callbackData, int eventData1, int eventData2)
{
    switch (event) {
      case EVENT_COMMIT:
        GetCtrlVal (filterpnl, FILTERPNL_FIRWINDOW, &firwindow);
        break;
      case EVENT_RIGHT_CLICK:
        MessagePopup ("Select FIR Window",
            "Selects the window used in the FIR filter (used in window mode
only).");
        break;
    }
    return 0;
}
int CVICALLBACK Getfirlength (int panel, int control, int event,
      void *callbackData, int eventData1, int eventData2)
{
    switch (event) {
      case EVENT_COMMIT:
        GetCtrlVal (filterpnl, FILTERPNL_FIRLENGTH, &firlength);
        if (!(firlength%2)) {
          firlength++;
          SetCtrlVal (filterpnl, FILTERPNL_FIRLENGTH, firlength);
        }
        break;
      case EVENT_RIGHT_CLICK:
        MessagePopup ("Select FIR Filter Length",
            "Sets the number of points for the FIR filter(Odd value between
1-79).");
        break;
    }
    return 0;
}
int CVICALLBACK Getkaibeta (int panel, int control, int event,
      void *callbackData, int eventData1, int eventData2)
{
    switch (event) {
      case EVENT_COMMIT:
        GetCtrlVal (filterpnl, FILTERPNL_KAISERBETA, &kaiserbeta);
        break;
      case EVENT_RIGHT_CLICK:
        MessagePopup ("Select Beta",
            "Sets the value for the beta parameter in the Kaiser window.");
        break;
    }
    return 0;
}
int CVICALLBACK Getfilterfunc (int panel, int control, int event,
      void *callbackData, int eventData1, int eventData2)
{
    switch (event) {
      case EVENT_COMMIT:
        GetCtrlVal (filterpnl, FILTERPNL_FILTERFUNC, &filterfunc);
        switch (filttype) {
          case 0: /*FIR*/
            switch (firfiltype) {
              case 0: /* WINDOW */
                switch (filterfunc) {
                  case 0: /* LOWPASS */
                    filtercode = 17; /* LP WINDOW FIR */
                    SetFilterPnlInputModes("10000100111100");
                    break;
```

```
                case 1: /* HIGHPASS */
                    filtercode = 18; /* HP WINDOW FIR */
                    SetFilterPnlInputModes("10000100111100");
                    break;
                case 2: /* BANDPASS */
                    filtercode = 19; /* BP WINDOW FIR */
                    SetFilterPnlInputModes ("10000100111110");
                    break;
                case 3: /* BANDSTOP */
                    filtercode = 20; /* BS WINDOW FIR */
                    SetFilterPntInputModes("10000100111110");
                    break;
            }
            break;
        case 1: /* KAISER */
            switch (filterfunc) {
                case 0: /* LOWPASS */
                    filtercode = 21; /* LP KAISER FIR */
                    SetFilterPnlInputModes ("10000100101101");
                    break;
                case 1: /* HIGHPASS */
                    filtercode = 22; /* HP KAISER FIR */
                    SetFilterPnlInputModes ("10000100101101");
                    break;
                case 2: /* BANDPASS */
                    filtercode = 23; /* BP KAISER FIR */
                    SetFilterPnlInputModes("10000100101111");
                    break;
                case 3: /* BANDSTOP */
                    filtercode = 24; /* BS KAISER FIR */
                    SetFilterPnlInputModes("10000100101111");
                    break;
            }
            break;
    }
    break;
case 1: /* IIR */
    switch (iirtype) {
        case 0: /* BUTTERWORTH */
            switch (filterfunc) {
                case 0: /* LOWPASS */
                    filtercode = 1; /* LP BUTTERWORTH IIR */
                    SetFilterPnlInputModes("11110100000000");
                    break;
                case 1: /* HIGHPASS */
                    filtercode = 2; /* HP BUTTERWORTH IIR */
                    SetFilterPnlInputModes("11110100000000");
                    break;
                case 2: /* BANDPASS */
                    filtercode = 3; /* BP BUTTERWORTH IIR */
                    SetFilterPnlInputModes("11111100000000");
                    break;
                case 3: /* BANDSTOP */
                    filtercode = 4; /* BS BUTTERWORTH IIR */
                    SetFilterPnlInputModes("11111100000000");
                    break;
            }
            break;
        case 1: /* CHEBYSHEV */
            switch (filterfunc) {
                case 0: /* LOWPASS */
                    filtercode = 5; /* LP CHEBYSHEV IIR */
                    SetFilterPnlInputModes("11110110000000");
                    break;
                case 1: /* HIGHPASS */
                    filtercode = 6; /* HP CHEBYSHEV IIR */
                    SetFilterPnlInputModes("11110110000000");
                    break;
                case 2: /* BANDPASS */
                    filtercode = 7; /* BP CHEBYSHEV IIR */
                    SetFilterPnlInputModes("11111110000000");
                    break;
                case 3: /* BANDSTOP */
                    filtercode = 8; /* BS CHEBYSHEV IIR */
                    SetFilterPnlInputModes("11111110000000");
                    break;
            }
            break;
        case 2: /* INV CHEBYSHEV */
```

```
                switch (filterfunc) {
                    case 0: /* LOWPASS */
                        filtercode = 9; /* LP INV CHEBYSHEV IIR */
                        SetFilterPnlInputModes("11110101000000");
                        break;
                    case 1: /* HIGHPASS */
                        filtercode = 10; /* HP INV CHEBYSHEV */
                        SetFilterPnlInputModes("11110101000000");
                        break;
                    case 2: /* BANDPASS */
                        filtercode = 11; /* BP INVERSE CHEBYSHEV */
                        SetFilterPnlInputModes("11111101000000");
                        break;
                    case 3: /* BANDSTOP */
                      filtercode = 12; /* BS INV CHEBYSHEV IIR */
                      SetFilterPnlInputModes("11111101000000");
                      break;
                      }
                      break;
                    case 3: /* ELLIPTIC */
                      switch (filterfunc) {
                        case 0: /* LOWPASS */
                          filtercode = 13; /* LP ELLIPTIC IIR */
                          SetFilterPnlInputModes("11110111000000");
                          break;
                        case 1: /* HIGHPASS */
                          filtercode = 14; /* HP ELLIPTIC IIR */
                          SetFilterPnlInputModes("11110111000000");
                          break;
                        case 2: /* BANDPASS */
                          filtercode = 15; /* BP ELLIPTIC IIR */
                          SetFilterPnlInputModes("11111111000000");
                          break;
                        case 3: /* BANDSTOP */
                          filtercode = 16; /* BS ELLIPTIC IIR */
                          SetFilterPnlInputModes("11111111000000");
                          break;
                      } /* END OF SWITCH ON FILTERFUNC */
                      break;
                    } /* END OF SWITCH ON IIRTYPE */
                    break;
                } /* END OF SWITCH ON FILTTYPE */
            break;
        case EVENT_RIGHT_CLICK:
            MessagePopup ("Select Filter Function",
                "Selects between lowpass, highpass, bandpass, and bandstop filters.");
            break;
        }
        return 0;
}
int CVICALLBACK Returntomain (int panel, int control, int event,
        void *callbackData, int eventData1, int eventData2)
{
    switch (event) {
        case EVENT_COMMIT:
            HidePanel (filterpnl);
            break;
        case; EVENT_RIGHT_CLICK:
            MessagePopup ("Return to Main Screen",
                "Applies the chosen filter parameters and returns to the data acquisition screen.");
            break;
        }
        return 0;
}
int CVICALLBACK ConfigureDaq (int panel, int control, int event,
        void *callbackData, int eventData1, int eventData2)
{
    switch (event) {
        case EVENT_COMMIT:
            DisplayPanel (daqpnl);
            break;
        case EVENT_RIGHT_CLICK:
            MessagePopup ("Configure DAQ", "Displays and allows user to change acquisition parameters.");
            break;
        }
        return 0;
```

-continued

```
}
int CVICALLBACK GetBoard (int panel, int control, int event,
        void *callbackData, int eventData1, int eventData2)
{
    switch (event) {
        case EVENT_COMMIT:
            GetCtrlVal (daqpnl, DAQPANEL_BOARD, &board);
            break;
        case EVENT_RIGHT_CLICK:
            MessagePopup ("Set Board Number",
                "Sets the data acquisition board number.");
            break;
    }
    return 0;
}
int CVICALLBACK Getchannel (int panel, int control, int event,
        void *callbackData, int eventData1, int eventData2)
{
    switch (event) {
        case EVENT_COMMIT:
            GetCtrlVal (daqpnl, DAQPANEL_CHANNEL, channel);
            break;
        case EVENT_RIGHT_CLICK:
            MessagePopup ("Set Channel Number",
                "Sets the channel number to acquire data from.");
            break;
    }
    return 0;
}
int CVICALLBACK Getsamprate (int panel, int control, int event,
        void *callbackData, int eventData1, int eventData2)
{
    switch (event) {
        case EVENT_COMMIT:
            GetCtrlVal (daqpnl, DAQPANEL_SAMPRATE, &samprate);
            if (fircutoff1 > (samprate/2)) {
                fircutoff1 = (samprate/2) - 100;
                SetCtrlVal (filterpnl, FILTERPNL_FIRCUTOFF1, fircutoff1);
            }
            if (fircutoff2 > (samprate/2)) {
                fircutoff2 = (samprate/2);
                SetCtrlVal (filterpnl, FILTERPNL_FIRCUTOFF2, fircutoff2);
            }
            if (iircutoff1 > (samprate/2)) {
                iircutoff1 = (samprate/2) - 100;
                SetCtrlVal (filterpnl, FILTERPNL_IIRCUTOFF1, iircutoff1);
            }
            if (iircutoff2 > (samprate/2)) {
                iircutoff2 = (samprate/2);
                SetCtrlVal (filterpnl, FILTERPNL_IIRCUTOFF2, iircutoff2);
            }
            SetCtrlAttribute (filterpnl, FILTERPNL_FIRCUTOFF1,
ATTR_MAX_VALUE,
                (samprate/2));
            SetCtrlAttribute (filterpnl, FILTERPNL_FIRCUTOFF2,
ATTR_MAX_VALUE,
                (samprate/2));
            SetCtrlAttribute (filterpnl, FILTERPNL_IIRCUTOFF1,
ATTR_MAX_VALUE,
                (samprate/2));
            SetCtrlAttribute (filterpnl, FILTERPNL_IIRCUTOFF2,
ATTR_MAX_VALUE,
                (samprate/2));
            break;
        case EVENT_RIGHT_CLICK:
            Messagepopup ("Set Sampling Rate",
                "Sets the sampling rate for acquiring data.");
            break;
    }
    return 0;
}
int CVICALLBACK Getpoints (int panel, int control, int event,
        void *callbackData, int eventData1, int eventData2)
{
    switch (event) {
        case EVENT_COMMIT:
            GetCtrlVal (daqpnl, DAQPANEL_POINTS, &points);
            break;
        case EVENT_RIGHT_CLICK:
```

```
                MessagePopup ("Set Number of Points",
                    "Sets the number of points to acquire and analyze with each
iteration.");
                break;
        }
        return 0;
}
int CVICALLBACK Quitdaqconf (int panel, int control, int event,
        void *callbackData, int eventData1, int eventData2)
{
    switch (event) {
        case EVENT_COMMIT:
            HidePanel (daqpnl);
            if (running = = 1)
            {
                if (signalswitch = = 1) {
                    AIClearAcquisition (task);
                    AIStartAcquisition (board, channel, 2*points, samprate, 10, 0,
&rate, &task);
                }
            }
            break;
        case EVENT_RIGHT_CLICK:
            MessagePopup ("Return to Main Screen",
                "Applies the chosen acquisition parameters and returns to the main
screen.");
            break;
    }
    return 0;
}
int CVICALLBACK Getdisplaymode (in,t panel, int control, int event,
        void *callbackData, int eventData1, int eventData2)
{
    switch (event) {
        case EVENT_COMMIT:
            GetCtrlVal (mainpnl, MAINPNL_FREQDISPLAY &displaymode);
            if(displaymode == 1) {
                SetInputMode (mainpnl, MAINPNL_SCALE, 0);
                SetCtrlAttribute (mainpnl, MAINPNL_FREQGRAPH, ATTR_XNAME,
"Time");
                SetCtrlAttribute (mainpnl, MAINPNL_FREQGRAPH, ATTR_YNAME,
"Volts");
                SetCtrlAttribute (mainpnl, MAINPNL_FREQGRAPH,
ATTR_LABEL_TEXT,
                    "Processed Time Waveform");
            }
            else {
                SetInputMode (mainpnl, MAINPNL_SCALE, 1);
                SetCtrlAttribute (mainpnl, MAINPNL_FREQGRAPH, ATTR_XNAME,
"Hertz");
                SetCtrlAttribute (mainpnl, MAINPNL_FREQGRAPH, ATTR_YNAME,
"Magnitude");
                SetCtrlAttribute (mainpnl, MAINPNL_FREQGRAPH,
ATTR_LABEL_TEXT,
                    "Power Spectrum");
            }
            break;
        case EVENT_RIGHT_CLICK:
            MessagePopup ("Graph Display Selection",
                "Selects between the processed time waveform or the frequency
spectrum for display on the lower graph.");
            break;
    }
    return 0;
}
int CVICALLBACK Callhelp (int panel, int control, int event,
        void *callbackData, int eventData1, int eventData2)
{
    switch (event) {
        case EVENT_COMMIT:
            SetCtrlAttribtite (mainpnl, MAINPNL_TIMER, ATTR_ENABLED, 0);
            HidePanel (mainpnl);
            DisplayPanel (helppnl);
            break;
        case EVENT_RIGHT_CLICK:
            MessagePopup ("Help",
                "Displays help and information about the program.");
            break;
    }
```

-continued

```
    return 0;
}
int CVICALLBACK Quithelp (int panel, int control, int event,
        void *callbackData, int eventData1, int eventData2)
{
    switch (event) {
        case EVENT_COMMIT:
            Hidepanel (helppnl);
            DisplayPanel (mainpnl);
            if (running = = 1)
            {
                SetCtrlAttribute (mainpnl, MAINPNL_TIMER, ATTR_ENABLED, 1);
                if (signalswitch = = 1) {
                    AIClearAcquisition (task);
                    AIStartAcquisition (board, channel, 2*points, samprate, 10, 0, &rate,
&task);
                }
            }
            break;
        case EVENT_RIGHT_CLICK:
            MessagePopup ("Exit Help",
                "Exits the help function and returns to the main panel.");
            break;
    }
    return 0;
}
int CVICALLBACK Scalegraphs (int panel, int control, int event,
        void *callbackData, int eventData1, int eventData2)
{
    switch (event) {
        case EVENT_COMMIT:
            SetCtrlAttribute (mainpnl, MAINPNL_TIMER, ATTR_ENABLED, 0);
            DisplayPanel (graphscalepnl);
            break;
        case EVENT_RIGHT_CLICK:
            MessagePopup ("Graph Scale Settings",
                "Allows user to set y-axis values for the graphs.");
            break;
    }
    return 0;
}
int CVICALLBACK Getwaveformymin (int panel, int control, int event,
        void *callbackData, int eventData1, int eventData2)
{
    switch (event) {
        case EVENT_COMMIT:
            GetCtrlVal (graphscalepnl, SCALEPNL_WAVEFORMYMIN,
&waveformymin);
            if (waveformymin >= waveformymax) {
                waveformymax = waveformymin + 1;
                SetCtrlVal (graphscalepnl, SCALEPNL_WAVEFORMYMAX,
waveformymax);
            }
            break;
        case EVENT_RIGHT_CLICK:
            MessagePopup ("Set Waveform Graph Y Axis Minimum",
                "Sets the minimum value of the y-axis on the upper graph.");
            break;
    }
    return 0;
}
int CVICALLBACK Getwaveformymax (int panel, int control, int event,
        void *callbackData, int eventData1, int eventData2)
{
    switch (event) {
        case EVENT_COMMIT:
            GetCtrlVal (graphscalepnl, SCALEPNL_WAVEFORMYMAX,
&waveformymax);
            if (waveformymax <= waveformymin) {
                waveformymax = waveformymin + 1;
                SetCtrlVal (graphscalepnl, SCALEPNL_WAVEFORMYMAX,
waveformymax);
            }
            break;
        case EVENT_RIGHT_CLICK:
            MessagePopup ("Set Waveform Graph Y Axis Maximum",
                "Sets the maximum value of the y-axis on the upper graph.");
            break;
    }
```

-continued

```
      return 0;
}
int CVICALLBACK Getspectrumlinmin (int panel, int control, int event,
      void *callbackData, int eventData1, int eventData2)
{
    switch (event) {
      case EVENT_COMMIT:
         GetCtrlVai (graphscalepnl, SCALEPNL_SPECTRUMLINMIN,
&spectrumlinmin);
         if (spectrumlinmin >= spectrumlinmax) {
            spectrumlinmax = spectrumlinmin + 1;
            SetCtrlVal (graphscalepnl, SCALEPNL_SPECTRUMLINMAX,
spectrumlinmax);
         }
         break;
      case EVENT_RIGHT_CLICK:
         MessagePopup ("Set Linear Scale Mode Y Axis Minimum",
            "Sets the minimum value of the y axis on the lower graph for linear
scale mode.");
         break;
    }
    return 0;
}
int CVICALLBACK Getspectrumlinmax (int panel, int control, int event,
      void *callbackData, int eventData1, int eventData2)
{
    switch (event) {
      case EVENT_COMMIT:
         GetCtrlVal (graphscalepnl, SCALEPNL_SPECTRUMLINMAX,
&spectrumlinmax);
         if (spectrumlinmax <= spectrumlinmin) {
            spectrumlinmax = spectrumlinmin + 1;
            SetCtrlVal (graphscalepnl, SCALEPNL_SPECTRUMLINMAX,
spectrumlinmax);
         }
         break;
      case EVENT_RIGHT_CLICK:
         MessagePopup ("Set Linear Scale Mode Y Axis Maximum",
            "Sets the maximum value of the y axis on the lower graph for linear
scale mode.");
         break;
    }
    return 0;
}
int CVICALLBACK Getspectrumdbmin (int panel, int control, int event,
      void *callbackData, int eventData1, int eventData2)
{
    switch (event) {
      case EVENT_COMMIT:
         GetCtrlVal (graphscalepnl, SCALEPNL_SPECTRUMDBMIN,
&spectrumdbmin);
         if (spectrumdbmin >= spectrumdbmax) {
            spectrumdbmax = spectrumdbmin + 1;
            SetCtrlVal (graphscalepnl, SCALEPNL_SPECTRUMDBMAX,
spectrumdbmax);
         }
         break;
      case EVENT_RIGHT_CLICK:
         MessagePopup ("Set dB Mode Y Axis Minimum",
            "Sets the minimum value of the y-axis for dB scale mode.");
         break;
    }
    return 0;
}
int CVICALLBACK Getspectrumdbmax (int panel, int control, int event,
      void *callbackData, int eventData1, int eventData2)
{
    switch (event) {
      case EVENT_COMMIT:
         GetCtrlVal (graphscalepnl; SCALEPNL_SPECTRUMDBMAX,
&spectrumdbmax);
         if (spectrumdbmax <= spectrumdbmin) {
            spectrumdbmax = spectrumdbmin + 1;
            SetCtrVal (graphscalepnl, SCALEPNL_SPECTRUMDBMAX,
spectrumdbmax);
         }
         break;
      case EVENT_RIGHT_CLICK:
         MessagePopup ("Set dB Mode Y Axis Maximum",
```

-continued

```
                "Sets the maximum value of the y-axis for dB scale mode.");
            break;
      }
      return 0;
}
/*****************************************************************/
int CVICALLBACK Getspectrumdbmmin (int panel, int control, int event,
      void *callbackData, int eventData1, int eventData2)
{
    switch (event) {
      case EVENT_COMMIT:
        GetCtrlVal (graphscalepnl, SCALEPNL_SPECTRUMDBMMIN,
&spectrumdbmmin);
        if (spectrumdbmmin >= spectrumdbmmax) {
           spectrumdbmmax = spectrumdbmmin + 1;
           SetCtrlVal (graphscalepnl, SCALEPNL_SPECTRUMDBMMAX,
spectrumdbmmax);
        }
        break;
      case EVENT_RIGHT_CLICK:
        MessagePopup ("Set dBm Mode Y Axis Minimum",
            "Sets the minimum value of the y-axis for dBm scale mode.");
        break;
      }
      return 0;
}
int CVICALLBACK Getspectrumdbmmax (int panel, int control, int event,
      void *callbackData, int eventData1, int eventData2)
{
    switch (event) {
      case EVENT_COMMIT:
        GetCtrlVal (graphscalepnl, SCALEPNL_SPECTRUMDBMMAX,
&spectrumdbmmax);
        if (spectrumdbmmax <= spectrumdbmmin) {
           spectrumdbmmax = spectrumdbmmin + 1;
           SetCtrVal (graphscalepnl, SCALEPNL_SPECTRUMDBMMAX,
spectrumdbmmax);
        }
        break;
      case EVENT_RIGHT_CLICK:
        MessagePopup ("Set dBm Mode Y Axis Maximum",
            "Sets the maximum value of the y-axis for dBm scale mode.");
        break;
      }
      return 0;
}
int CVICALLBACK Gettimewavemin (int panel, int control, int event,
      void *callbackData, int eventData1, int eventData2)
{
    switch (event) {
      case EVENT_COMMIT:
        GetCtrlVal (graphscalepnl, SCALEPNL_TIMEWAVEMIN, &timewavemin);
        if (timewavemin >= timewavemax) {
           timewavemax = timewavemin + 1;
           SetCtrlVal (graphscalepnl, SCALEPNL_TIMEWAVEMAX, timewavemax);
        }
        break;
      case EVENT_RIGHT_CLICK:
        MessagePopup ("Set Time Waveform Mode Y Axis Minimum",
            "Sets the minimum value of the y-axis for Time Waveform display
mode.");
        break;
      }
      return 0;
}
int CVICALLBACK Gettimewavemax (int panel, int control, int event,
      void *callbackData, int eventData1, int eventData2)
{
    switch (event) {
      case EVENT_COMMIT:
        GetCtrVal (graphscalepnl, SCALEPNL_TIMEWAVEMAX,
&timewavemax);
        if (timewavemax <= timewavemin) {
           timewavemax = timewavemin + 1;
           SetCtrlVal (graphscalepnl, SCALEPNL_TIMEWAVEMAX; timewavemax);
        }
        break;
      case EVENT_RIGHT_CLICK:
        MessagePopup ("Set Time Waveform Mode Y Axis Maximum",
```

-continued

```
             "Sets the maximum value of the y-axis for Time Waveform display
mode.");
         break;
      }
      return 0;
}
int CVICALLBACK Quitgraphscaling (int panel, int control, int event,
      void *callbackData, int eventData1, int eventData2)
{
    switch (event) {
      case EVENT_COMMIT:
         HidePanel (graphscalepnl);
         if (running = = 1) {
            SetCtrlAttribute (mainpnl, MAINPNL_TIMER, ATTR_ENABLED, 1);
         }
         break;
      case EVENT_RIGHT_CLICK:
         MessagePopup ("Exit Graph Scale Selection",
                "Exits the graph scaling mode and returns to main panel.");
         break;
    }
    return 0;
}
int CVICALLBACK Getsignalswitch (int panel, int control, int event,
      void *callbackData, int eventData1, int eventData2)
{
    switch (event) {
      case EVENT_COMMIT:
         GetCtrlVal (daqpnl, DAQPANEL_SIGNALSWITCH, &signalswitch);
         if (signalswitch = = 0) {
            SetInputMode (daqpnl, DAQPANEL_CHANNEL, 0);
            SetInputMode (daqpnl, DAQPANEL_SAMPRATE, 0);
            SetInputMode (daqpnl, DAQPANEL_SIMSIGNALTYPE, 1);
            SetInputMode (daqpnl, DAQPANEL_SIMSIGNALFREQ, 1);
         }
         else {
            SetInputMode (daqpnl, DAQPANEL_CHANNEL, 1);
            SetInputMode (daqpnl, DAQPANEL_SAMPRATE, 1);
            SetInputMode (daqpnl, DAQPANEL_SIMSIGNALTYPE, 0);
            SetInputMode (daqpnl, DAQPANEL_SIMSIGNALFREQ, 0);
            DisableBreakOnLibraryErrors ( );
            errorchk = Init_DA_Brds (board, &boardcode);
            if (errorchk = = 0) {
               Set_DAQ_Device_Info (board, ND_DATA_XFER_MODE_AI,
ND_UP_TO_1_DMA_CHANNEL);
               if (running = = 1) {
                  AIClearAcquisition (task);
                  AIStartAcquisition (board, channel, 2*points, samprate, 10, 0, &rate,
&task);
               }
            }
            else {
               MessagePopup ("Board Configuration Error",
                   "The board you specified could not be configured. Please
check the board number and configuration. The system has been reset to simulated
data mode.");
               signalswitch = 0;
               SetCtrlVal (daqpnl, DAQPANEL_SIGNALSWITCH, signalswitch);
               SetInputMode (daqpnl, DAQPANEL_CHANNEL, 0);
               SetInputMode (daqpnl, DAQPANEL_SAMPRATE, 0);
               SetInputMode (daqpnl, DAQPANEL_SIMSIGNALTYPE, 1);
               SetInputMode (daqpnl, DAQPANEL_SIMSIGNALFREQ, 1);
            }
         }
         break;
      case EVENT_RIGHT_CLICK:
         MessagePopup ("Select Data Source",
                "Selects between simulated data and data acquired from a DAQ
board.");
         break;
    }
    return 0;
}
int CVICALLBACK Getsimsignaltype (int panel, int control, int event,
      void *callbackData, int eventData1, int eventData2)
{
    switch (event) {
      case EVENT_COMMIT:
         GetCtrlVal (daqpnl, DAQPANEL_SIMSIGNALTYPE, &simsignaltype);
```

-continued

```
            break;
        case EVENT_RIGHT_CLICK:
            MessagePopup ("Select Simulated Wave Type",
                "Selects the simulated wave type.");
            break;
    }
    return 0;
}
int CVICALLBACK Getsimsignalfreq (int panel, int control, int event,
        void *callbackData, int eventData1, int eventData2)
{
    switch (event) {
        case EVENT_COMMIT:
        case EVENT_VAL_CHANGED:
            GetCtrlVal (daqpnl, DAQPANEL_SIMSIGNALFREQ, &simsignalfreq);
            break;
        case EVENT_RIGHT_CLICK:
            MessagePopup ("Select Simulated Wave Frequency",
                "Selects the frequency of the simulated wave data.");
            break;
    }
    return 0;
}
```

Having described my invention in such terms as the enable those skilled in the art to understand and practice it, and having defined and identified the presently preferred embodiments thereof, I claim:

1. A noise measurement test system for making phase noise measurements of signals produced from a unit under test (UUT) having a UUT input and a UUT output, said noise measurement test system comprising:
    a variable amplifier having an amplifier input for receiving signals from a unit under test and an amplifier output for coupling to a mixer;
    a variable low noise source for producing a low noise signal, said low noise source including a splitter for splitting said low noise signal into a first low noise carrier signal for being output from a first output and a second low noise signal for being output from a second output, said first output for coupling to a UUT input and said second output for coupling to a variable phase shifter;
    a variable phase shifter including a phase shifter input coupled to said second output of said low noise source and a phase shifter output for coupling to a mixer, said variable phase shifter for adjusting the phase of said second low noise signal received from said second output of said low noise source;
    a mixer including first and second mixer inputs and a mixer output, said first mixer input coupled to said amplifier output, said second mixer input coupled to said phase shifter output and said mixer output for coupling to a processor, said mixer including a synchronous phase detector for synchronizing signals received at said first and second inputs for outputting a measurement test signal from said mixer output; and
    a processor including a processor input coupled to said mixer output, said processor also including control links for connecting said processor to said amplifier, said low noise source and said phase shifter for automatically controlling the adjustments of said amplifier, said low noise source and said phase shifter.

2. The noise measurement test system for making phase noise measurements of signals produced from a unit under test (UUT) of claim 1 further comprising a display means connected to said processor for producing an image illustrating characteristics of said measurement test signal output from said mixer.

3. The noise measurement test system for making phase noise measurements of signals produced from a unit under test (UUT) of claim 2 wherein said display means comprises a spectrum analyzer.

4. The noise measurement test system for making phase noise measurements of signals produced from a unit under test (UUT) of claim 1 further comprising an analog-to-digital converter coupled between said mixer and said processor.

5. The noise measurement test system for making phase noise measurements of signals produced from a unit under test (UUT) of claim 1 further comprising a low noise matching amplifier coupled between said mixer and said processor.

6. The noise measurement test system for making phase noise measurements of signals produced from a unit under test (UUT) of claim 5 wherein said processor includes a control link connected to said low noise matching amplifier for automatically adjusting the gain of said low noise matching amplifier.

7. The noise measurement test system for making phase noise to measurements of signals produced from a unit under test (UUT) of claim 5 wherein said processor includes a control link connected to said low noise matching amplifier for automatically adjusting the impedance of said low noise matching amplifier.

8. The noise measurement test system for making phase noise measurements of signals produced from a unit under test (UUT) of claim 1 wherein said processor automatically adjusts the operation of said low noise source to produce said low noise signal at different preselected offset frequencies, said processor also automatically controlling said amplifier and said phase shifter to ensure that said signals received by said mixer are in phase quadrature.

9. A method of measuring the signal noise of a unit under test (UUT) using a test measurement system including a variable amplifier, a variable low noise source, a variable phase shifter, a mixer, a video display, and a processor including control links for controlling said amplifier, the low noise source and the phase shifter, the method of measuring the signal noise comprising the step of:
    creating a low noise signal by said low noise source according to commands from said processor;

splitting said low noise signal into a first low noise carrier signal and a second low noise signal;

routing said first low noise carrier signal through said unit under test and said amplifier to said mixer;

routing said second low noise signal through said phase shifter to said mixer;

routing an output signal from said mixer to said processor; and adjusting the amplifier and phase shifter according to commands from said processor to place said signals received by said mixer in phase quadrature.

10. The method of measuring the signal noise of a unit under test (UUT) of claim 9 further comprising the steps of:

automatically adjusting the operation of said low noise source to produce said low noise signal at different preselected offset frequencies; and automatically controlling said amplifier and said phase shifter to ensure that said signals received by said mixer are in phase quadrature.

11. A method of calibrating a noise measurement test system comprising the steps of:

providing a carrier signal; and providing a plurality of calibration signals at various amplitude levels relative to said carrier signal.

12. The method of calibrating a noise measurement test system of claim 11 further comprising the steps of:

providing a plurality of calibration signals at various frequency offsets relative to said carrier signal.

13. A method of calibrating a noise measurement test system comprising the steps of:

providing a carrier signal; and providing a plurality of calibration signals at various frequency offsets relative to said carrier signal.

* * * * *